(12) United States Patent
Lee et al.

(10) Patent No.: US 7,880,164 B2
(45) Date of Patent: Feb. 1, 2011

(54) CONDUCTING POLYMER COMPOSITION AND ELECTRONIC DEVICE INCLUDING LAYER OBTAINED USING THE CONDUCTING POLYMER COMPOSITION

(75) Inventors: Tae-Woo Lee, Seoul (KR); Yi-Yeol Lyu, Yongin-si (KR); Jong-Jin Park, Guri-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1142 days.

(21) Appl. No.: 11/480,876

(22) Filed: Jul. 6, 2006

(65) Prior Publication Data

US 2007/0138483 A1 Jun. 21, 2007

(30) Foreign Application Priority Data

Dec. 19, 2005 (KR) .................. 10-2005-0125455

(51) Int. Cl.
*H01L 51/54* (2006.01)
(52) U.S. Cl. ............ 257/40; 257/E51.046; 313/504; 428/690
(58) Field of Classification Search .......... 257/40, 257/E51.001–E51.052; 438/99; 313/504; 428/690
See application file for complete search history.

(56) References Cited

U.S. PATENT DOCUMENTS

| | | | |
|---|---|---|---|
| 4,356,429 A | 10/1982 | Tang | |
| 4,433,088 A * | 2/1984 | Haaf et al. | 524/153 |
| 4,672,265 A | 6/1987 | Eguchi et al. | |
| 4,948,690 A * | 8/1990 | Hisamura et al. | 430/60 |
| 5,645,948 A | 7/1997 | Shi et al. | |
| 5,728,801 A | 3/1998 | Wu et al. | |
| 5,821,309 A | 10/1998 | Oka | |
| 5,834,100 A * | 11/1998 | Marks et al. | 428/209 |
| 6,201,051 B1 | 3/2001 | Mager et al. | |
| 6,214,937 B1 * | 4/2001 | Kennedy et al. | 525/100 |
| 6,281,285 B1 * | 8/2001 | Becker et al. | 524/837 |
| 6,307,083 B1 | 10/2001 | Igarash | |
| 6,517,958 B1 * | 2/2003 | Sellinger et al. | 428/690 |
| 6,599,635 B1 * | 7/2003 | Mechtel et al. | 428/449 |

(Continued)

FOREIGN PATENT DOCUMENTS

JP 11-003781 1/1999

(Continued)

OTHER PUBLICATIONS

He, C., et al. "Highly Efficient Luninescent Organic Clusters with Quantum Dot-Like Properties." J. Am. Chem. Soc., vol. 126 (2004): pp. 7792-7793.*

(Continued)

*Primary Examiner*—Matthew W Such
(74) *Attorney, Agent, or Firm*—Robert E. Bushnell, Esq.

(57) ABSTRACT

A conducting polymer composition containing a siloxane material of Formula (1) below and a conducting polymer, and an electronic device including a layer formed using the conducting polymer composition:

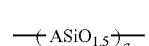

(1)

where A and a are the same as described in the detailed description of the invention. The electronic device including the layer formed using the conducting polymer composition has excellent electrical characteristics and long lifetime.

28 Claims, 5 Drawing Sheets

U.S. PATENT DOCUMENTS

| | | | |
|---|---|---|---|
| 6,605,373 B2 | 8/2003 | Woo et al. | |
| 6,616,863 B1 | 9/2003 | Angelopoulos et al. | |
| 6,660,410 B2 | 12/2003 | Hosokawa | |
| 6,830,830 B2* | 12/2004 | Hsieh et al. | 428/690 |
| 6,897,473 B1* | 5/2005 | Burroughes et al. | 257/40 |
| 6,900,285 B2 | 5/2005 | Woo et al. | |
| 7,372,611 B2* | 5/2008 | Tonar et al. | 359/267 |
| 2002/0149025 A1* | 10/2002 | Andriessen et al. | 257/98 |
| 2003/0120099 A1* | 6/2003 | Laine et al. | 556/450 |
| 2003/0204038 A1* | 10/2003 | Xiao et al. | 528/10 |
| 2003/0211358 A1* | 11/2003 | Kitano et al. | 428/690 |
| 2004/0024164 A1* | 2/2004 | Lyu et al. | 528/10 |
| 2004/0138355 A1* | 7/2004 | Saito et al. | 524/261 |
| 2004/0209116 A1* | 10/2004 | Ren et al. | 428/690 |
| 2005/0035346 A1* | 2/2005 | Bazan et al. | 257/40 |
| 2005/0123760 A1* | 6/2005 | Cammack et al. | 428/403 |
| 2005/0142381 A1 | 6/2005 | Lyu et al. | |
| 2005/0212406 A1* | 9/2005 | Daniels et al. | 313/503 |
| 2007/0045619 A1* | 3/2007 | Park et al. | 257/40 |
| 2007/0048532 A1 | 3/2007 | Lyu et al. | |
| 2007/0112133 A1* | 5/2007 | Lee et al. | 525/100 |
| 2007/0138483 A1 | 6/2007 | Lee et al. | |

FOREIGN PATENT DOCUMENTS

| | | |
|---|---|---|
| JP | 11-329734 | 11/1999 |
| JP | 2000-215987 | 8/2000 |
| JP | 2004-220931 | 8/2004 |
| JP | 2006-108458 | 4/2006 |
| JP | 2006108458 A * | 4/2006 |
| KR | 1020030097658 | 12/2003 |
| KR | 1020040056662 | 7/2004 |
| KR | 10-2004-0070561 | 8/2004 |
| KR | 1020050032691 | 4/2005 |
| KR | 1020050056001 | 6/2005 |
| KR | 1020050077367 | 8/2005 |
| WO | WO 95-01871 | 1/1995 |
| WO | WO 00/65653 | 11/2000 |

OTHER PUBLICATIONS

Rinaldi, A.W., et al. "Electrical, Spectroscopic, and Thermal Properties of Blends Formed by PEDOT, PVC, and PEO." J. Appl. Poly. Sci., vol. 96 (2005): 1710-1715.*

Brick, C.M., et al. "Robust Polyaromatic Octasilsesquioxanes from Polybromophenylsilsesquioxanes, BrxOPS, via Suzuki Coupling." Macromolecules, vol. 38 (2005): pp. 4661-4665.*

Lin, W.-J., et al. "Synthesis and Optoelectronic Properties of Starlike Polyflourenes with a Silsesquioxane Core." Macromolecules, vol. 37 (2004): pp. 2335-2341.*

Ghosh, S., et al. "Supramolecular Self-Assembly for Enhanced Conductivity in Conjugated Polymer Blends: Ionic Crosslinking in Blends of Poly(3,4-ethylenedioxythiophene)-Poly(styrenesulfonate) and Poly(vinylpyrrolidone)." Adv. Mater., vol. 10, No. 14 (1998): pp. 1097-1099.*

Machine Translation of JP 2006108458.*

Kalinowski, J., et al. "Injection-Controlled Electroluminescence in Organic Light-Emitting Diodes Based on Molecularly-Doped Polymers: II. Double-Layer Devices." J. Phys. D: Appl. Phys., vol. 34 (2001): pp. 2282-2295.*

Chou, J.H., et al. "Synthesis and Characterization of Luminescent Polyfluorenes Incorporating Side-Chain-Tethered Polyhedral Oligomeric Silsesquioxane Units." Macromol., vol. 38 (2005): pp. 745-751.*

Cerveau, G. & Corriu, R.J.P. "Some Recent Developments of Polysilsesquioxanes Chemistry for Material Science." Coor. Chem. Rev., vol. 178-180 (1998): pp. 1051-1071.*

Kuwabara et al., "Thermally Stable Multilayered Organic Electroluminescent Devices Using Novel Starburst Molecules, 4,4',4"-Tri(N-carbazolyl)triphenylamine (TCTA) and 4,4',4"-Tri(3-methylphenylphenyl-amino)triphenylamine (m-MTDATA), as Hole-Transport Materials", Adv. Mater. 1994, 6, No. 9, pp. 677-679.

Wei-Jung Lin et al., "Synthesis and Optoelectronic Properties of Starlike Polyfluorenes with a Silsesquioxane Core", Macromolecules 2004, 37, 2335-2341.

Chad M. Brick et al., "Robust Polyaromatic Octasilsesquioxanes from Polybromophenylsilsesquioxanes, BrxOPS, via Suzuki Coupling", Macromolecules 2005, 38, 4661-4665.

Chaobin He et al., "Highly Efficient Luminescent Organic Clusters with Quantum Dot-Like Properties", J. Am. Chem. Soc. 2004, 126, 7792-7793.

Machine Translation of JP 2006-108458.

*Translation of JP 2000-215987 into English.*

Müller et al. *Acta Cryst.* 2003, E59, o1838-o1839. Date of on-line publication; Oct. 31, 2003.

*Machine translation of JP 2004-220931.*

*Machine translation of JP 11-003781.*

Chinese Office Action issued by the Chinese Patent Office dated Jun. 10, 2010, No. 200610093262.2 together with a Request for Entry.

Chinese Office Action issued on Jul. 30, 2010 and Request for Entry of the Accompanying Office Action herewith.

* cited by examiner

CONDUCTING POLYMER COMPOSITION AND ELECTRONIC DEVICE INCLUDING LAYER OBTAINED USING THE CONDUCTING POLYMER COMPOSITION

CROSS-REFERENCE TO RELATED PATENT APPLICATIONS AND CLAIM OF PRIORITY

This application claims the benefit of Korean Patent Application No. 10-2005-0125455, filed on Dec. 19, 2005, in the Korean Intellectual Property Office, the disclosure of which is incorporated herein in its entirety by reference. Furthermore, the present application is related to two co-pending U.S. applications: 1) Ser. No. 11/448,142, entitled ORGANOSILOXANE COMPOUND AND ORGANIC LIGHT-EMITTING DEVICE COMPRISING THE SAME based upon Korean Patent Application Serial No. 10-2005-0078720 filed in the Korean Intellectual Property Office on 26 Aug. 2005, and filed in the U.S. Patent & Trademark Office on 7 Jun. 2006: and 2) Ser. No. 11/517,480, entitled CONDUCTING POLYMER COMPOSITION AND ELECTRONIC DEVICE INCLUDING LAYER OBTAINED USING THE CONDUCTING POLYMER COMPOSITION based upon Korean Patent Application Serial No. 10-2005-0108523filed in the Korean Intellectual Property Office on 14 Nov. 2005, and filed in the U.S. Patent & Trademark Office on 8 Sep. 2006.

BACKGROUND OF THE INVENTION

1. Field of the Invention

The present invention relates to a conducting polymer composition and an electronic device including a layer obtained using the conducting polymer composition, and more particularly, to a conducting polymer composition containing a siloxane material and a conducting polymer, and an electronic device including a layer obtained using the conducting polymer composition. The layer obtained using the conducting polymer composition includes a network of conducting polymer chains and has improve adhesion to an electrode formed of, for example, indium tin oxide (ITO), indium zinc oxide (IZO), etc. An (opto-)electronic device including such a layer has excellent electrical and optical characteristics and longer lifetime.

2. Description of the Related Art

Intensive research into various next generation electronic devices including, for example, emitting devices, photovoltaic devices, electrochromic devices, electrophoretic devices, organic thin film transistors, organic memory devices, etc. has been conducted.

Among the above-listed electronic devices, light emitting diodes, which are self-emissive devices, have the advantages of a large viewing angle, a high contrast, and a short response time. Light emitting diodes can be classified into inorganic light emitting diodes using an inorganic compound in their emitting layer and organic light emitting diodes (OLEDS) using an organic compound in their emitting layer. OLEDs have higher brightness, lower driving voltage, and shorter response time than inorganic light emitting diodes and can achieve full color display. Due to these advantages of OLEDs, much research into OLEDs has been performed.

OLEDs have a stacked structure including an anode, an organic light emitting layer, and a cathode. OLEDs can have various structures including, for example, a stack of an anode, a hole injecting layer, a hole transporting layer, an emitting layer, an electron transporting layer, an electron injecting layer, and a cathode, a stack of an anode, a hole injecting layer, a hole transporting layer, an emitting layer, a hole blocking layer, an electron transporting layer, an electron injecting layer, and a cathode, etc.

WO 00/65653 discloses an organic thin film semiconductor device including a Cu electrode, a layer formed of PEDOT-PSS (Poly(3,4-ethylene dioxy thiophene)-Poly(4-styrenesulfonate), an emitting layer, and a cathode.

However, since PSS in PEDOT-PSS is highly hygroscopic and can absorb about 25% of moisture in the air, the layer formed of PEDOT-PSS contains moisture. In addition, byproducts, such as a catalyst used in the synthesis of PEDOT-PSS, metal ions (Na ions, etc.), sulfate, etc. may exist in the layer formed of PEDOT-PSS. PSS can generate sulfate in the layer of PEDOT-PSS by reacting with electrons. When the anode underlying the layer formed of PEDOT-PSS is formed of ITO or IZO, due to the strong acidity (pH of about 1.8) of PEDOT-PSS, the anode are etched, thereby resulting in impurities, such as indium (In), tin (S), zinc (Zn), oxygen (O), etc., in the layer of PEDOT-PSS. In other words, the layer formed of PEDOT-PSS may contain impurities and moisture for the above-described reasons. Accordingly, when such impurities and moisture diffuse into the emitting layer, the light emitting efficiency and lifetime of the device deteriorate. Therefore, an improvement regarding these problems is required.

SUMMARY OF THE INVENTION

The present invention provides a conducting polymer composition containing a siloxane material and a conducting polymer, and an electronic device including a layer obtained using the conducting polymer composition.

According to an aspect of the present invention, there is provided a conducting polymer composition containing a siloxane material of Formula (1) below and a conducting polymer:

$$-(\!\operatorname{ASiO}_{1.5})_{\overline{a}}\!- \tag{1}$$

where A is a C1-C20 alkyl group, a C6-C30 aryl group, a C1-C20 alkoxy group, a C7-C30 alkylaryl group, a C7-C30 aralkyl group, or $-(CH_2)_n-MZ_1Z_2Z_3$; n is 0 or an integer from 1 to 20; M is Si, Ti, Sn, or Al; each of $Z_1$, $Z_2$, and $Z_3$ is independently a C1-C20 alkyl group, a C6-C30 aryl group, a C7-C30 alkylaryl group, a C7-C30 aralkyl group, a crosslinkable unit, a hole transport unit, an electron transport unit, or an emissive unit; and a is an integer from 2 to 1,000.

According to another aspect of the present invention, there is provided an electronic device comprising a layer obtained using the above-described conducting polymer composition.

Since the conducting polymer composition contains the siloxane material in addition to the conducting polymer, the siloxane material forming a network of conducting polymer chains and having strong adhesion to an electrode material, such as ITO or IZO, the electronic device including the layer obtained using the conducting polymer composition has excellent electrical characteristics and long lifetime.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
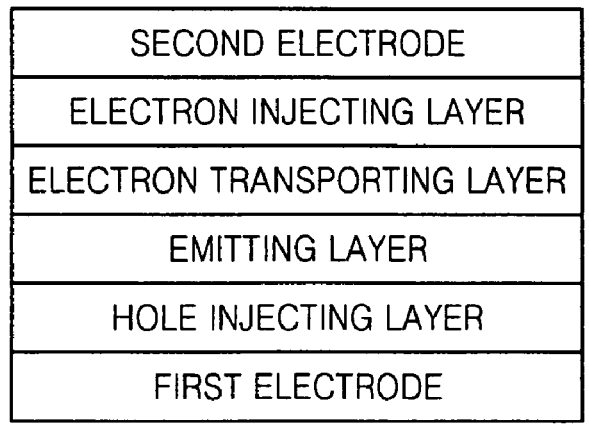
FIGS. 1A through 1C illustrate structures of organic light-emitting devices as electronic devices according to embodiments of the present invention.

Hereinafter, the present invention will be described in detail

A conducting polymer composition according to the present invention includes a siloxane material and a conducting polymer. The siloxane material forms a network of conducting polymer chains. Therefore, the mobility of the conducting polymer chains in the layer formed of the conducting polymer composition is restricted, thereby preventing migration of various impurities (for example, impurities originating from an anode) and moisture to other layers. In addition, the siloxane material has strong adhesion to various electrode materials, such as ITO, IZO etc. Therefore, the electrical characteristics and lifetime of an electronic device including a layer obtained using the conducting polymer composition can be improved.

In particular, a conducting polymer composition according to the present invention includes a siloxane material of Formula (1) below and a conducting polymer:

(1)

where A is a C1-C20 alkyl group (preferably, a C1-C10 alkyl group), a C6-C30 aryl group (preferably, a C6-C20 aryl group), a C1-C20 alkoxy group (preferably, a C1-C10 alkoxy group), a C7-C30 alkylaryl group (preferably, a C7-C20 alkylaryl group), a C7-C30 aralkyl group (preferably, a C7-C20 aralkyl group), or $-(CH_2)_n-MZ_1Z_2Z_3$; n is 0 or an integer from 1 to 20; M is Si, Ti, Sn, or Al; and each of $Z_1$, $Z_2$, and $Z_3$ is independently a C1-C20 alkyl group (preferably, a C1-C10 alkyl group), a C6-C30 aryl group (preferably, a C6-C20 aryl group), a C7-C30 alkylaryl group (preferably, a C7-C20 alkylaryl group), a C7-C30 aralkyl group (preferably, a C7-C20 aralkyl group), a cross-linkable unit, a hole transport unit, an electron transport unit, or an emissive unit. In other words, the siloxane material of Formula (1) includes Si and O in an atomic number ratio of 1:1.5, wherein an A group such as described above is linked to Si.

In Formula (1), a is an integer from 2 to 1,000.

In Formula (1), the cross-linkable unit can be any unit causing various crosslinkage through, for example, dehydration condensation reaction, etc., and is not limited. For example, the cross-linkable unit can be, but is not limited to, a hydroxyl group, a C1-C20 alkoxy group, or a halogen atom.

In Formula (1), the hole transport unit can be, but is not limited to,

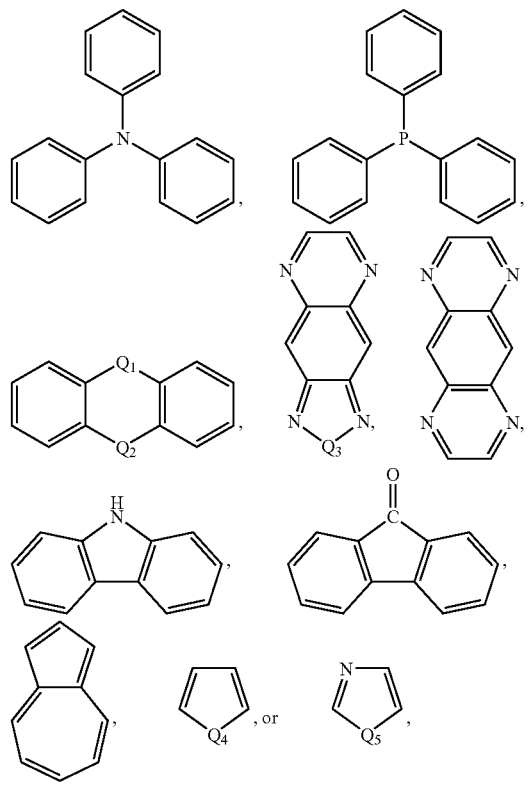

where each of $Q_1$, $Q_2$, $Q_3$, $Q_4$, and $Q_5$ can be independently N, O, or S.

In Formula (1), the electron transport unit can be, but is not limited to,

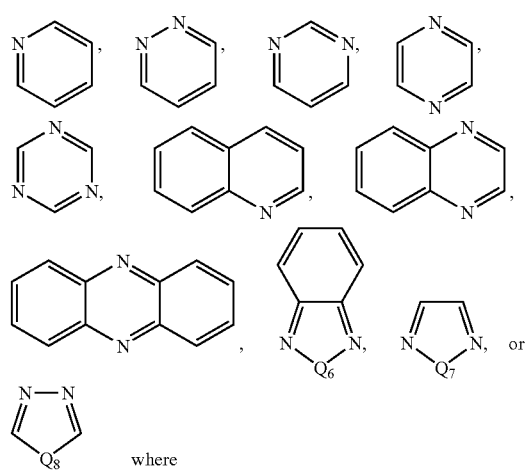

where each of $Q_6$, $Q_7$ and $Q_8$ can be independently N, O, or S.

In Formula (1), the emissive unit is a C6-C30 aromatic cyclic system or a C5-C30 hetero aromatic cyclic system, which include one or at least two rings which are fused or are bonded by a single bond or a vinylene group.

In particular, examples of the emissive unit include, but are not limited to,

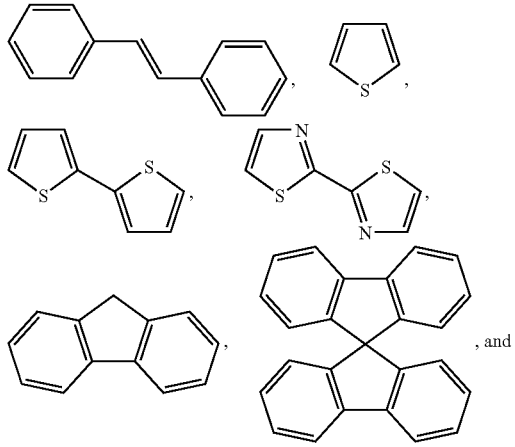

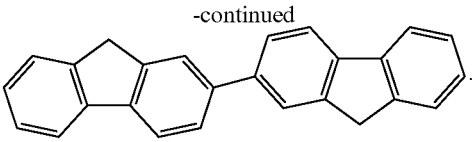

At least a portion of the emissive unit may include such a hole transport unit or an electron transport unit. In this case, the emissive unit has both the ability to emit light and the ability to transport holes or electrons.

In an embodiment according to the present invention, the siloxane material of Formula (1) may have Formula (2) below.

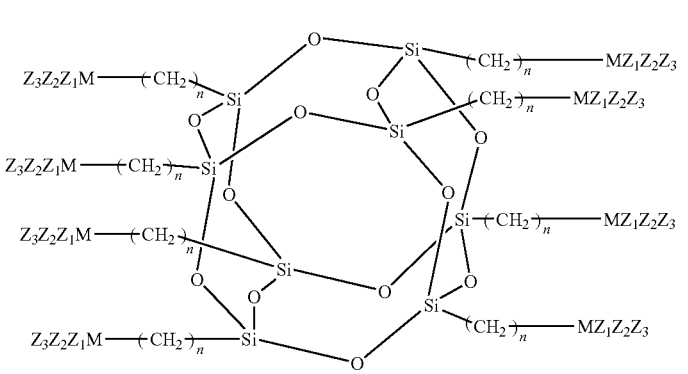

(2)

The siloxane material of Formula (2) is a material with a=8 and —$(CH_2)_n MZ_1 Z_2 Z_3$ as A in Formula (1) above and has a cage structure. The definitions provided above in connection with Formula (1) can be referred to for n, M, $Z_1$, $Z_2$ and $Z_3$ in Formula (2). In Formula (2), the eight —$(CH_2)_n MZ_1 Z_2 Z_3$ groups can be the same or different.

In particular, the siloxane material may have one of Formulae (2a), (2b), and (2c) below, but not limited thereto.

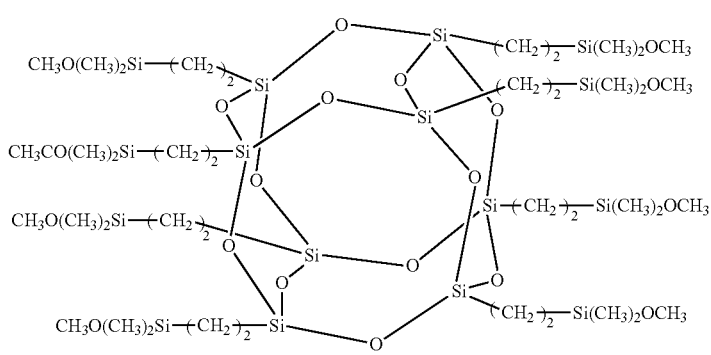

(2a)

-continued
(2b)
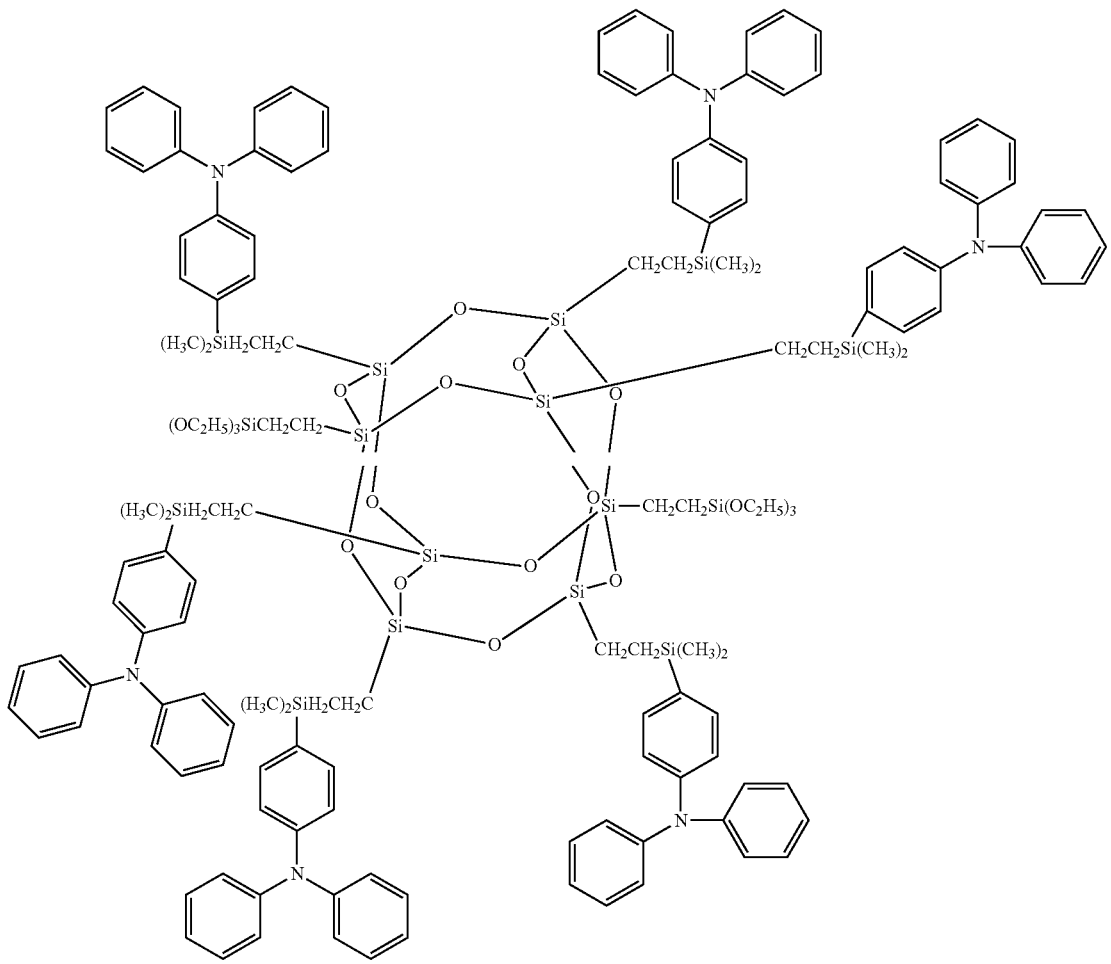
(2c)
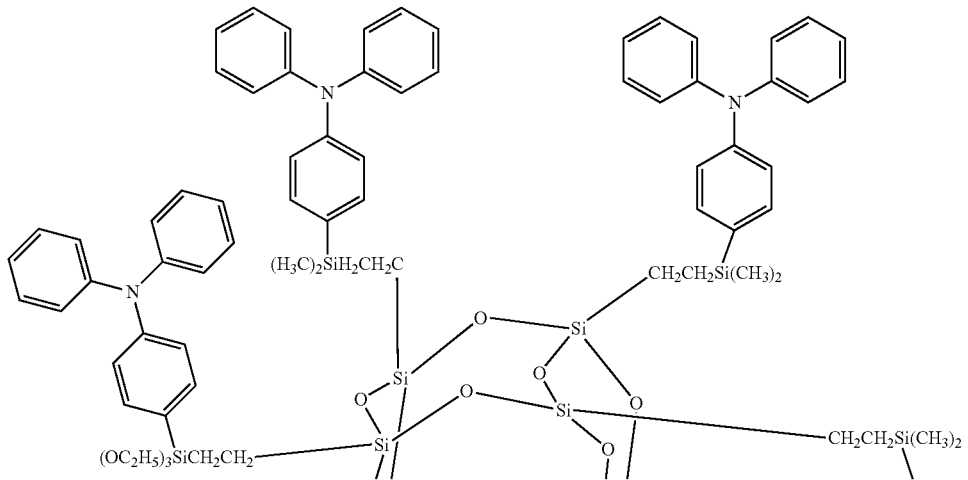

-continued

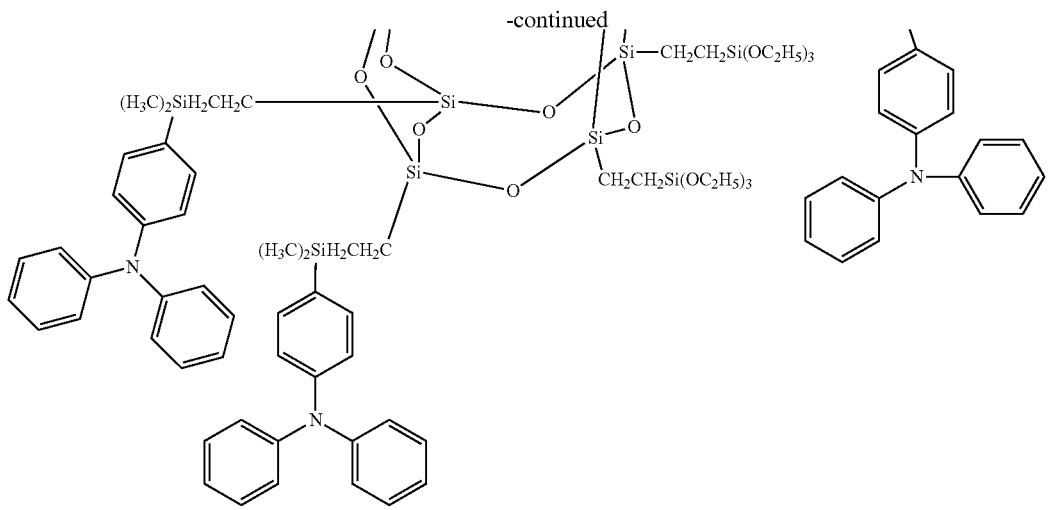

It will be appreciated by one of ordinary skill in the art that the siloxane material of Formula (2) can be synthesized using a known method The siloxane material of Formula (1) can be a hydrolysate or a condensate of at least one compound selected from the group consisting of a compound of Formula (2), a compound of Formula (3), a compound of Formula (4), a compound of Formula (5), and a compound of Formula (6).

laryl group), a C7-C30 aralkyl group (preferably, a C7-C20 aralkyl group), a cross-linkable unit, a hole transport unit, an electron transport unit, or an emissive unit. The eight —$(CH_2)_n MZ_1 Z_2 Z_3$ groups can be the same or different.

In Formulae (2) through (6), each of $R_1$ and $R_2$ can be independently —$CH_2(CH_2)_m SiX_1 X_2 X_3$, —O—$SiX_4 X_5 X_6$, a cross-linkable unit, a hole transpory unit, an electron transport unit, an emissive unit, hydrogen, a halogen atom, a

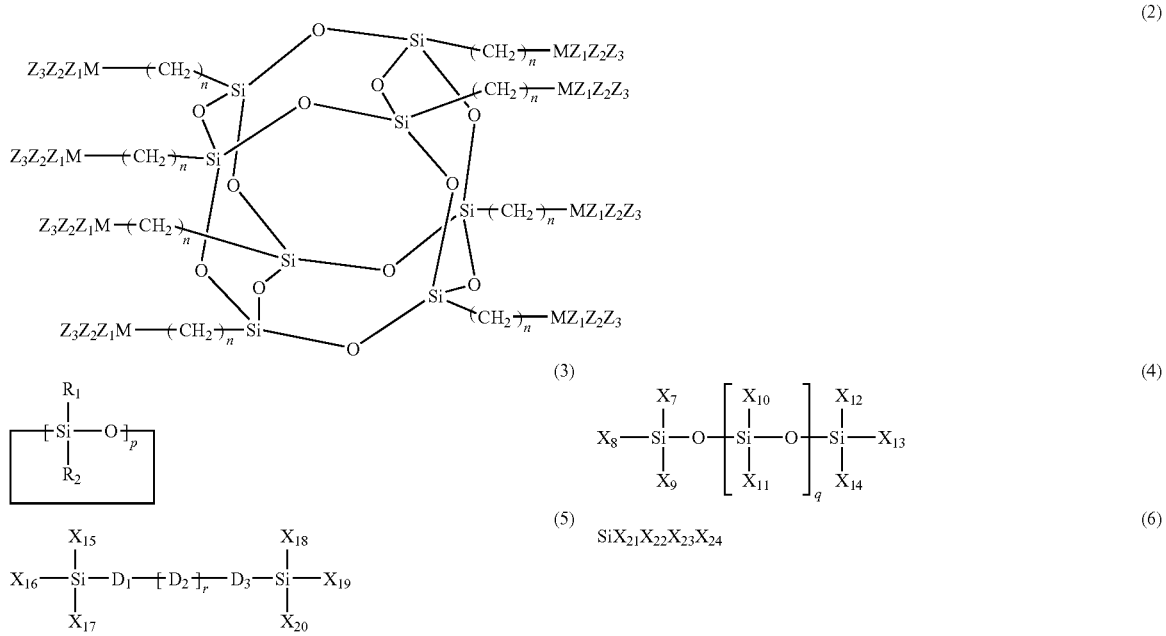

In Formulae (2) through (6), n can be 0 or an integer from 1 to 20.

In Formulae (2) through (6), M can be Si, Ti, Sn, or Al.

In Formulae (2) through (6), each of $Z_1$, $Z_2$, and $Z_3$ can be independently a C1-C20 alkyl group (preferably, a $C_1$-$C_{10}$ alkyl group), a C6-C30 aryl group (preferably, a C6-C20 aryl group), a C7-C30 alkylaryl group (preferably, a C7-C20 alky- C1-C20 alkyl group, or a C6-C30 aryl group. Here, at least one of $R_1$ and $R_2$ can be —$CH_2(CH_2)_m SiX_1 X_2 X_3$, —O—$SiX_4 X_5 X_6$, or a cross-linkable unit.

In Formulae (2) through (6), each of $X_1$, $X_2$, $X_3$, $X_4$, $X_5$, $X_6$, $X_7$, $X_8$, $X_9$, $X_{10}$, $X_{11}$, $X_{12}$, $X_{13}$, $X_{14}$, $X_{15}$, $X_{16}$, $X_{17}$, $X_{18}$, $X_{19}$, $X_{20}$, $X_{21}$, $X_{22}$, $X_{23}$, and $X_{24}$ is independently a cross-linkable unit, a hole transport unit, an electron transport unit, an emissive unit, hydrogen, a halogen atom, or a C1-C20 alkyl group. Here, at least one of $X_1$, $X_2$, and $X_3$, at least one of $X_4$, $X_5$, and $X_6$, at least one of $X_7$, $X_8$, $X_9$, $X_{10}$, $X_{11}$, $X_{12}$, $X_{13}$, and $X_{14}$, at least one of $X_{15}$, $X_{16}$, $X_{17}$, $X_{18}$, $X_{19}$, and $X_{20}$, and at least one of $X_{21}$, $X_{22}$, $X_{23}$, and $X_{24}$ may be a cross-linkable unit.

In Formulae (2) through (6), $D_1$ is a single bond or —O—, $D_2$ can be a C1-C20 alkylene group, a C1-C20 alkylene group substituted with at least one halogen atom, —(CF$_2$)$_b$—O—, a C1-C20 alkylene group substituted with at least one of a hole transport unit, an electron transport unit, or an emissive unit, or a divalent hole transport unit. Here, b is an integer from 1 to 20. $D_3$ can be a single bond, a C1-C20 alkylene group substituted with at least one halogen atom, or a C1-C20 alkylene group. Here, fluorine may be used as a halogen atom.

In Formulae (2) through (6), p can be an integer from 3 to 8.

In Formulae (2) through (6), m can be an integer from 1 to 10.

In Formulae (2) through (6), q can be 0 or an integer from 1 to 10.

In Formulae (2) through (6), r can be 0 or an integer from 1 to 10.

In Formulae (2) through (6), $X_{10}$ can be the same or different from each other.

In Formulae (2) through (6), $X_{11}$ can be the same or different from each other.

In Formulae (2) through (6), $D_2$ can be the same or different from each other.

The definitions of the cross-linkable unit, the hole transport unit, the electron transport unit, and the emissive unit described above can be referred to for those in Formulae (2) through (6). It will be appreciated by one of ordinary skill in the art that the cross-linkable unit, the hole transport unit, the electron transport unit, and the emissive group in Formulae (2) through (6) can be a monovalent group or a divalent group according to the chemical structure. For example, the "divalent hole transport unit" used in connection with Formula (5) means that D in Formula (5) is a divalent group.

Each of the alkyl group, aryl group, alkoxy group, alkylaryl group, aralkyl group, hole transport unit, electron transport unit, emissive unit, etc., can be unsubstituted or substituted with —F; —Cl; —Br; —CN; —NO2; —OH; an unsubstituted or a —F, —Cl, —Br, —CN, —NO2, or —OH substituted C1-C20 alkyl group; an unsubstituted or a —F, —Cl, —Br, —CN, —NO2, or —OH substituted C1-C20 alkoxy group; an unsubstituted or a C1-C20 alkyl, C1-C20 alkoxy, —F, —Cl, —Br, —CN, —NO2, or —OH substituted C6-C30 aryl group; an unsubstituted or a C1-C20 alkyl, C1-C20 alkoxy, —F, —Cl, —Br, —CN, —NO2, or —OH substituted C2-C30 heteroaryl group; an unsubstituted or a C1-C20 alkyl, C1-C20 alkoxy, —F, —Cl, —Br, —CN, —NO2, or —OH substituted C5-C20 cycloalkyl group; or an unsubstituted or a C1-C20 alkyl, C1-C20 alkoxy, —F, —Cl, —Br, —CN, —NO2, or —OH substituted C5-C30 heterocycloalkyl group.

In the Formulae throughout the specification, examples of alkyl group include, but are not limited to, methyl, ethyl, propyl, isobutyl, sec-butyl, pentyl, iso-amyl, hexyl, etc.

In the Formulae throughout the specification, the aryl group refers to a carbocyclic aromatic system including at least one ring in which two or more rings may be attached together in a pendent manner or may be fused. The term "aryl" refers to an aromatic radical, such as phenyl, naphthyl, tetrahydronaphthyl, but are not limited thereto.

In the Formulae throughout the specification, the alkylaryl group refers to an aryl group described above which is substituted with at least one alky group described above.

In the Formulae throughout the specification, the aralkyl group refers to an alkyl group described above which has an end substituted with an aryl group described above.

In an embodiment of the present invention, the compound of Formula (3) can be represented by one of Formulae (3a), (3b), (3c), (3d), (3e), (3f), and (3g), but not limited thereto.

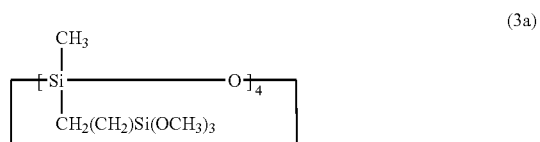

(3a)

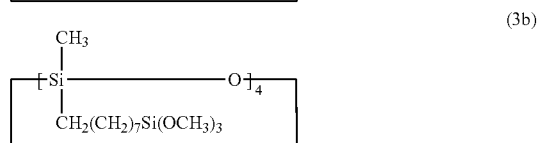

(3b)

(3c)

(3d)

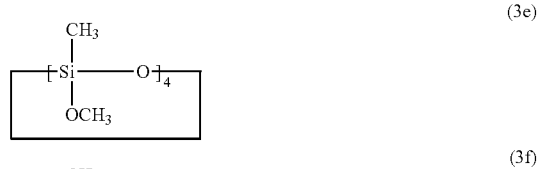

(3e)

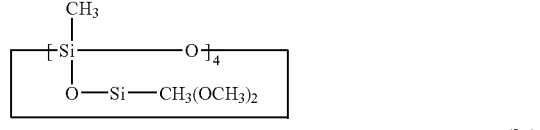

(3f)

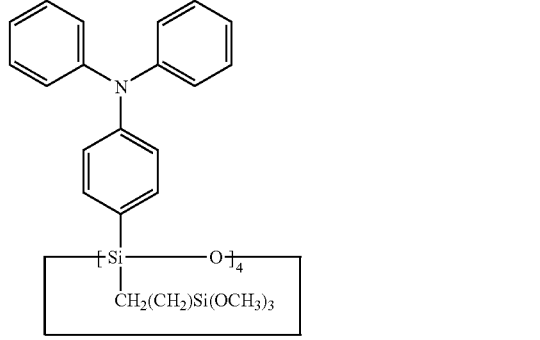

(3g)

In another embodiment of the present invention, the compound of Formula (4) can be represented by one of Formulae (4a), (4b), (4c), and (4d), but not limited thereto.

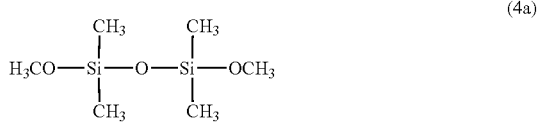

(4a)

-continued

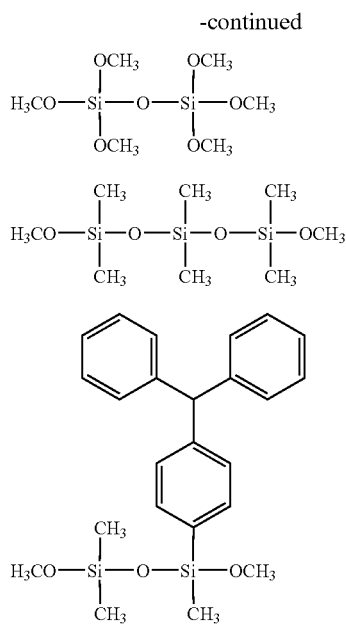

In another embodiment of the present invention, the compound of Formula (5) can be represented by one of Formulae (5a), (5b), (5c), and (5d), but not limited thereto.

In another embodiment of the present invention, the compound of Formula (6) can be represented by one of Formulae (6a) and (6b), but not limited thereto.

As described above, the siloxane material according to the present invention can be a hydrolysate or a condensate of at least one of the compounds of Formulae (2) through (6). A hydrolysis or condensation reaction for the siloxane material can be carried out using various known methods. For example, the hydrolysis or condensation reaction can be carried out in an organic solvent using an acid catalyst or an acid catalyst and water.

Examples of the acid or base catalyst used in the hydrolysis or condensation reaction include, but are not limited to, hydrochloric acid, nitric acid, benzene sulfonic acid, oxalic acid, formic acid, potassium hydroxide, sodium hydroxide, triethylamine, sodium bicarbonate, and pyridine.

The amount of the catalyst used in the hydrolysis or condensation reaction is determined such that the molar ratio of at least one of the compounds of Formulae (2) through (6) to the catalyst is in a range of 1:0.000001-1:10.

The amount of water used in the hydrolysis or condensation reaction is determined such that the molar ratio of at least one of the compounds of Formulae (2) through (6) to the catalyst is in a range of 1:1-1:1,000.

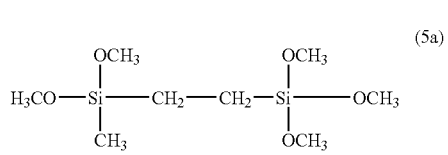

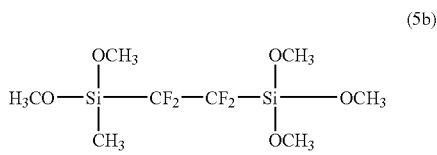

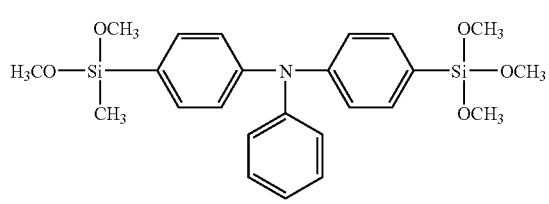

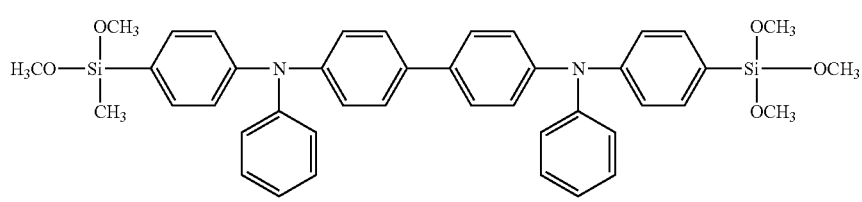

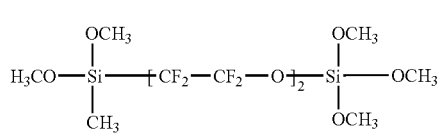

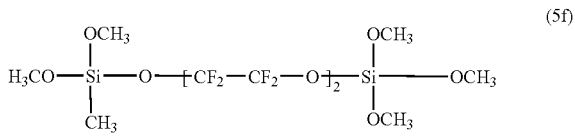

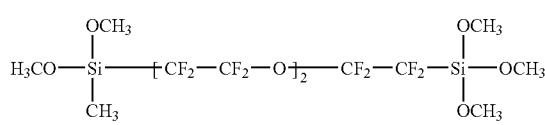

The reaction temperature of the hydrolysis or condensation reaction can be in a range of 0-200° C., and the reaction time can be 0.1-100 hours.

Examples of the organic solvent used in the hydrolysis or condensation reaction include, but are not limited to: aliphatic hydrocarbon solvents, such as hexane, etc.; aromatic hydrocarbon solvents, such as anisole, mesitylene, xylene, etc.; ketone-based solvents, such as methyl isobutyl ketone, 1-methyl-2-pyrrolidinone, acetone, etc.; ether-based solvents, such as cyclohexanone, tetrahydrofuran, diethylether, isopropyl ether, etc.; acetate-based solvents, such as ethyl acetate, butyl acetate, propylene glycol methyl ether acetate, etc.; alcohol-based solvents, such as isopropyl alcohol, butyl alcohol, etc.; amide-based solvents, such as dimethylacetamide, dimethylformamide, etc.; silicon-based solvents; and a mixture of at least two thereof.

The weight average molecular weight of the siloxane material of Formula (1) described above may be 500,000 or less, preferably, 100-10,000. When the weight average molecular weight of the siloxane material exceeds 500,000, the siloxane material cannot easily dissolve and/or disperse in the conducting polymer composition, and thus it is difficult to form a layer.

The conducting polymer composition according to the present invention includes a conducting polymer in addition to the siloxane material. Any common polymer having conductivity can be used as the conducting polymer without limitation. Examples of the conducting polymer include polythiophene, polyaniline, polypyrrole, polyacetylene, polyvinylenephenylene, polyphenylene, polyfluorene, poly(ethylenedioxythiophene), poly(arylamine), a derivative thereof, etc.

The conducting polymer composition according to the present invention may include the siloxane material of Formula (1) and the conducting polymer in a weight ratio of 0.01:99.9 to 20:80, preferably, 0.1:99.9 to 10:90. When the amount of the siloxane material is too small to be below the range, the effect of forming a network of conducting polymer chains is negligible. When the amount of the siloxane material is too large to be above the range, the conductivity of a layer formed using the composition is too low.

The conducting polymer composition according to the present invention may further include acid. The acid may include at least one atom selected from the group consisting of C, S, N, O, Si, F, Cl, and H; and/or at least one functional group selected from the group consisting of a hydroxyl group, a C1-C20 alkyl hydroxyl group, a C1-C20 alkoxy group, a C1-C20 alkyl group, a halogen atom, a cyano group, a nitro group, a C6-C30 aryl group, a C1-C20 alkylamino group, a C6-C30 aryloxy group, a C6-C30 arylamino group, a C1-C20 alkyl epoxy group, a vinyl group, a C1-C20 alkylmercapto group, an acetoxy group, a thiol group, and an imide group.

In particular, the acid may include organic ions, such as sulfonic acid, phosphonic acid, or carboxylic acid, and counter ions, such as H or alkali metal ions.

The acid can be paired with a conducting polymer, for example, like Pani/DBSA (polyaniline/dodecylbenzenesulfonic acid), PEDOT/PSS (poly(3,4-ethylenedioxythiophene)/poly(4-styrenesulfonate), Pani/CSA (polyaniline/camphorsulfonic acid), PANI/PSS (polyaniline/poly(4-styrenesulfonate)), Pani/PAAMPSA (polyaniline/poly(2-acrylamido-2-methyl-1-propanesulfonic acid), etc.

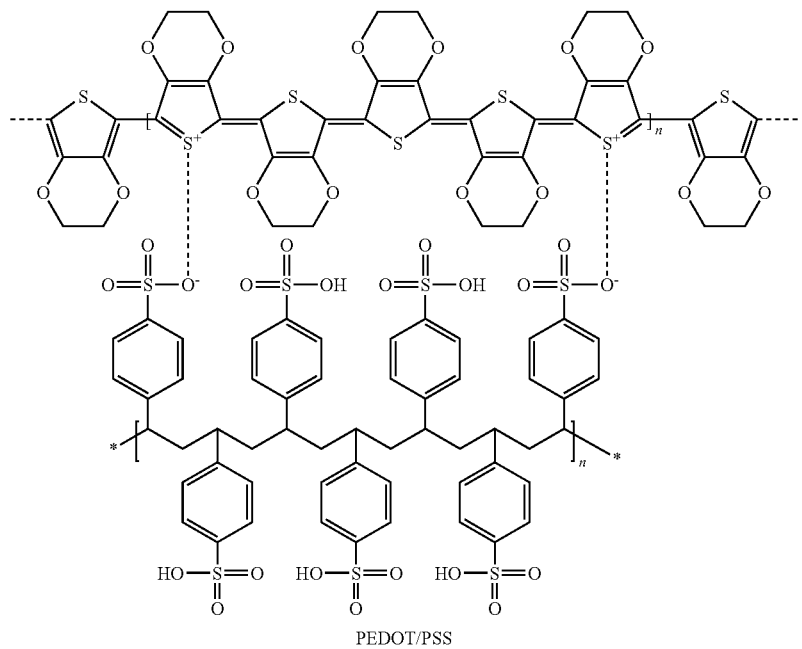

PEDOT/PSS

-continued

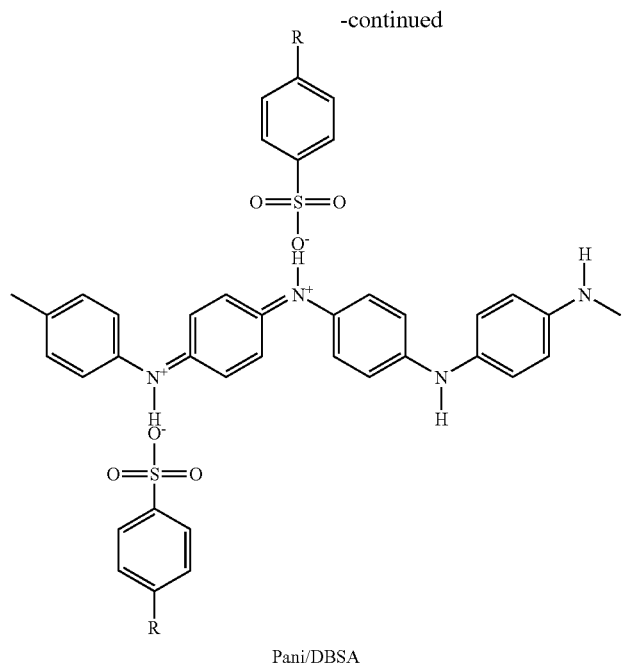

Pani/DBSA

The conducting polymer composition according to the present invention may further include a crosslinking agent. The crosslinking agent assists the siloxane material in networking conducting polymer chains. Any common crosslinking agent can be used. For example, an epoxy crosslinking agent, an acrylate crosslinking agent, etc., but not limited thereto, can be used.

The conducting polymer composition according to the present invention may further include metal nanoparticles. The metal nanoparticles further improve the conductivity of the layer obtained using the conducting polymer composition.

The metal nanoparticles can be at least one kind of nanoparticles selected from the group consisting of Au, Ag, Cu, Pd, and Pt nanoparticles. The metal nanoparticles may have an average particle diameter of 5-50 nm. When the average particle diameter of the metal nanoparticles is smaller than 5 nm, the nanoparticles may easily aggregate. When the average particle diameter of the metal nanoparticles is larger than 50 nm, the surface smoothness of the layer cannot be controlled.

The conducting polymer composition according to the present invention may further include inorganic nanoparticles. When forming a layer using the conductive polymer composition, the inorganic nanoparticles disperse in the layer and make conduction in the network of conductive polymer chains in the network easier and enhances the network.

The inorganic nanoparticles can be at least one kind of $SiO_2$ nanoparticles and $TiO_2$ nanoparticles. The average diameter of the inorganic nanoparticles can be in a range of 5-50 nm. When the average diameter of the inorganic nanoparticles is less than 5 nm, the nanoparticles easily agglomerate. When the average diameter of the inorganic nanoparticles is larger than 50 nm, it is difficult to control the surface smoothness of the layer.

When forming a layer using the conducting polymer composition, for example, after the conducting polymer composition is dissolved or dispersed in a predetermined solvent and coated on a predetermined substrate, drying and/or thermal treatment can be performed.

The solvent gives a viscosity of the conducting polymer composition described above. Any solvent that can dissolve or disperse the conducting polymer composition can be used without limitation. Examples of the solvent include, but are not limited to, water, alcohol, toluene, xylene, chlorobenzene, chloroform, di-chloroethane, dimethylformamide, dimethyl sulfoxide, etc. The conducting polymer composition can be coated on a predetermined substrate using various known methods, for example, spin coating, dip coating, inkjet printing, nozzle printing, etc. The coated layer is dried and/or thermally-treated, thereby completing the formation of the layer.

The layer obtained using the conducting polymer composition described above is suitable to be used as a conducing layer of various electronic devices. Examples of electronic devices include, but are not limited to, organic light-emitting devices, photovoltaic devices, electrochromic devices, electrophoretic devices, organic thin film transistors, organic memory devices, etc.

In particular, an electronic device including the layer obtained using the conducting polymer composition according to the present invention can be an organic light-emitting device. In general, the organic light-emitting device has a structure including a first electrode, a second electrode, and an emitting layer between the first and second electrodes. Alternatively, the organic light-emitting device can have various structures, for example, a structure further including between the first and second electrodes at least one layer such as a hole injecting layer, a hole transporting layer, a hole blocking layer, an electron blocking layer, an electron transporting layer, and an electron injecting layer. When manufacturing an organic light-emitting device, the layer obtained using the conducting polymer composition according to the present invention can be used as a hole injecting layer or a hole transporting layer of the organic light-emitting device.

Figure 1B:
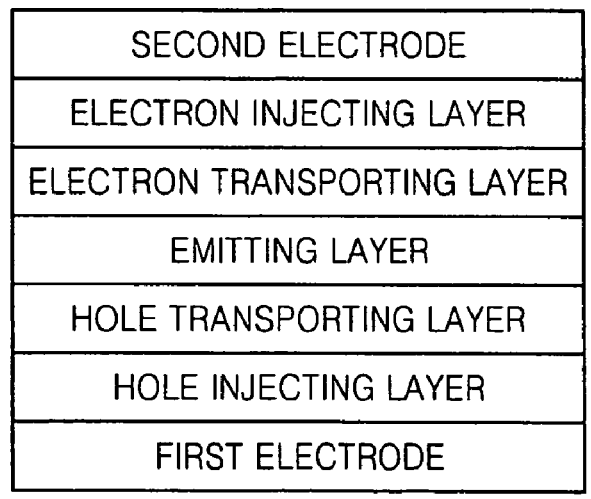
Figure 1C:
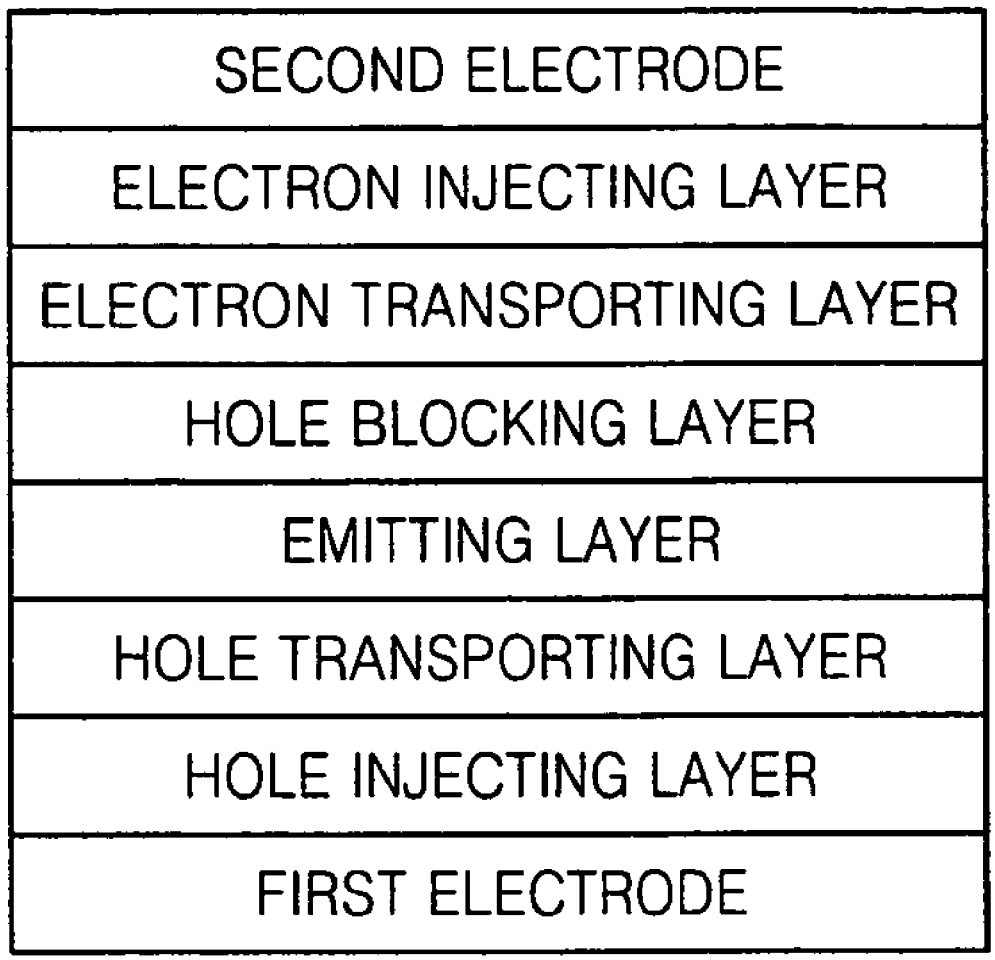

Schematic structures of organic light-emitting devices as electronic devices according to embodiments of the present invention are shown in FIGS. 1A, 1B, and 1C. The organic light-emitting device of FIG. 1A has a structure including a first electrode, a hole injecting layer, an emitting layer, an electron transporting layer, an electron injecting layer, and a second electrode. The organic light-emitting device of FIG. 1B has a structure including a first electrode, a hole injecting layer, a hole transporting layer, an emitting layer, an electron transporting layer, an electron injecting layer, and a second electrode. The organic light-emitting device of FIG. 1C has a structure including a first electrode, a hole injecting layer, a hole transporting layer, an emitting layer, a hole blocking layer, an electron transporting layer, an electron injecting layer, and a second electrode. Organic light-emitting devices can have other various structures, for example, a structure including a first electrode, a hole injecting layer, an emitting layer, and a second electrode.

The emitting layer of an organic light-emitting device according to the present invention can contain a phosphorescent or fluorescent dopant of red, green, blue, or white. The phosphorescent dopant can be an organic metal compound containing at least one selected from the group consisting of Ir, Pt, Os, Ti, Zr, Hf, Eu, Tb, and Tm.

Hereinafter, a method of manufacturing an organic light-emitting device according to the present invention will be described with reference to the organic light-emitting device shown in FIG. 1C.

Initially, a first electrode is formed on a substrate using a first electrode material by deposition, sputtering, or etc. The first electrode can be an anode. Any substrate commonly used in organic light-emitting devices can be used. For example, a glass substrate which is mechanically strong, thermally stable, transparent, easy to handle, and highly waterproof, and has excellent surface flatness, or a transparent plastic substrate can be used. Examples of the first electrode material include indium tin oxide (ITO), indium zinc oxide (IZO), tin oxide (SnO2), zinc oxide (ZnO), etc., which are transparent and have excellent conductivity.

Next, a hole injecting layer (HIL) is formed on the first electrode using various methods, for example, vacuum deposition, spin coating, inkjet printing, nozzle printing, spray printing, organic vapor jet printing, organic vapor phase deposition, casting, LB, etc.

When forming the hole injecting layer (HIL) using vacuum deposition, the deposition conditions can vary according to the compound used as a material for the hole injecting layer, the structure or thermal characteristics of the hole injecting layer, etc. In general, the deposition temperature can be in a range of 100-500° C., the degree of vacuum can be in a range of 10-8 or 10-3 torr, and the deposition rate can be in a range of 0.01-100 Å/sec.

When forming the hole injecting layer (HIL) using spin coating, the coating conditions can vary according to the compound used as a material for the hole injecting layer, the structure or thermal characteristics of the hole injecting layer, etc. In general, the coating rate can be in a range of 2,000 to 5,000 rpm, and the temperature of a thermal treatment performed to remove solvent after the coating can be in a range of 80-200° C.

The hole injecting layer can be formed using the conducting polymer composition according to the present invention described above. Alternatively, examples of a material for the hole injecting layer include, but are not limited to, phthalocyanine compounds, such as copper phthalocyanine, etc., disclosed in U.S. Pat. No. 4,356,429, star-burst type amine derivatives disclosed in Advanced Material 6, p. 677 (1994), such as TCTA, m-MTDATA, and m-MTDAPB, Pani/DBSA (polyaniline/dodecylbenzenesulfonic acid), PEDOT/PSS (poly(3,4-ethylenedioxythiophene)/poly(4-styrenesulfonate), Baytron®) P series Products of H.C. Starck GmBH Co.), Pani/CSA (polyaniline/camphorsulfonic acid), PANI/PSS ((polyaniline)/poly (4-styrenesulfonate)), Pani/PAAMPSA (polyaniline/poly(2-acrylamido-2-methyl-1-propanesulfonic acid), etc.

The thickness of the hole injecting layer can be 50 to 10,000 Å, preferably, 100 to 1,000 Å. When the thickness of the hole injecting layer is less than 50 Å, hole injection characteristics may deteriorate. When the thickness of the hole injecting layer exceeds 10,000 Å, the driving voltage rises.

Next, a hole transporting layer (HTL) can be formed on the hole injecting layer using various methods, such as vacuum deposition, spin coating, inkjet printing, nozzle printing, spray printing, organic vapor jet printing, organic vapor phase deposition, casting, LB, etc. When the hole transporting layer (HTL) is formed using vacuum deposition or spin coating, the deposition conditions and the coating conditions can vary according to the compound used as a material for the hole transporting layer (HTL). However, in general, the deposition conditions and the coating conditions are determined in the same ranges as applied to form the hole injecting layer (HIL).

The hole transporting layer (HTL) can be formed using the conducting polymer composition according to the present invention described above. Alternatively, examples of a material for the hole transporting layer (HTL) include, but are not limited to, common hole transporting materials, for examples, carbazole derivatives, N-phenyl carbazole, polyvinylcarbazole, etc., general amine derivatives having an aromatic fused ring, such as N,N'-bis(3-methyl phenyl)-N,N'-diphenyl-[1,1-biphenyl]-4,4'-diamine (TPD), N,N'-di (naphthalene-1-yl)—N,N'-diphenyl benzidine (a-NPD), etc., PEDOT/PSS (for example, Baytron® P series products of H C. Starck GmBH Co.).

The thickness of the hole transporting layer may be in a range of 50-1,000 Å, preferably, 100-600 Å. When the thickness of the hole transporting layer is less than 50 Å, the hole transportation characteristics may degrade. When the thickness of the hole transporting layer exceeds 1,000 Å, the driving voltage rises.

Next, the emitting layer (EML) is formed on the hole transporting layer (HTL) using vacuum deposition, spin coating, inkjet printing, nozzle printing, casting, LB, etc. When the emitting layer (EML) is formed using vacuum deposition or spin coating, the deposition conditions and the coating conditions can vary according to the compound used as a material for the emitting layer (EML). However, in general, the deposition conditions and the coating conditions are determined in the same ranges as applied to form the hole injecting layer (HIL).

The emitting layer (EML) can be formed using a material which is known as a material for the emitting layer (EML). Examples of the material for the emitting layer (EML) include, but are not limited to, polyfluorene polymers, polyphenylene polymers, polyphenylenevinylene polymers, polythiophene polymers, polyquinoline polymers, polypyrrole polymers, polyacetylene polymers, spirofluorene polymers, for example, a spirofluorene polymer including indenofluorene repeating units having a spiroanthracene structure, cyclopentaphenanthrene polymers, polyarylene polymers having an indole carbazole unit or phenoxazine unit, a derivative thereof, which can be used in combination of two or more. In addition to polymers, low molecular materials or oligomers can be used for the emitting layer. A combination of a host and a dopant can be used. Examples of the host include, but are not limited to, Alq3, CBP (4,4'-N,N'-dicarbazolyl-biphenyl), PVK (poly(n-vinylcarbazole)), mCP (N,N'-dicarbazolyl-3,5-benzene), etc. Examples of fluorescent dopants include IDE102, IDE105, which are available from Idemitsu Co., C545T, which is available from Hayashibara Co., etc. Examples of phosphorescent dopants include, but are not limited to, PtOEP, RD 61 of UDC Co., which are red phosphorescent dopants, Ir (PPy)3(PPy=2-phenylpyridine), which is a green phosphorescent dopant, F2Irpic, which is a green phosphorescent dopant, etc.

Other examples of materials which can be used for the emitting layer (EML) are disclosed in Korean Patent Publication Nos. 2005-0077367, 2005-0056001, 2005-0032691, 2004-0056662, and 2003-0097658 and U.S. Pat. Nos. 6,900,285, 6,605,373, 5,728,801, the disclosures of which are incorporated herein in their entirety by reference.

The amount of dopants is not specifically limited, but can be in a range of 0.01-15 parts by weight based on 100 parts by weight of the host.

The thickness of the emitting layer can be in a range of 100-3,000 Å, preferably, 200-1,000 Å. When the thickness of the emitting layer is less than 100 Å, the emitting characteristics may degrade. When the thickness of the emitting layer exceeds 3,000 Å, the driving voltage rises.

When a phosphorescent dopant is used in the emitting layer (EML), to prevent diffusion of triplet excitons or holes into the electron transporting layer (ETL), a hole blocking layer (HBL) can be formed on the emitting layer (EML) using vacuum deposition, spin coating, inkjet printing, nozzle printing, spray printing, organic vapor jet printing, organic vapor phase deposition, casting, LB, etc. When forming the hole blocking layer (HBL) using vacuum deposition or spin coating, the deposition conditions and the coating conditions can vary according to the compound used as a material for the hole blocking layer (HBL). However, in general, the deposition conditions and the coating conditions are determined in the same ranges as applied to form the hole injecting layer (HIL). Examples of a material for the hole blocking layer (HBL) that can be used include, for example, oxadiazole derivatives, triazole derivatives, phenanthroline derivatives, BCP, etc.

The thickness of the hole blocking layer (HBL) can be in a range of 50-1,000 Å, preferably, 100-300 Å. When the thickness of the hole blocking layer (HBL) is less than 50 Å, the hole blocking characteristics may deteriorate. When the thickness of the hole blocking layer (HBL) exceeds 1,000 Å, the driving voltage rises.

Next, an electron transporting layer (ETL) is formed using various methods, for example, vacuum deposition, spin coating, inkjet printing, nozzle printing, spray printing, organic vapor jet printing, organic vapor phase deposition, casting, etc. When the electron transporting layer (ETL) is formed using vacuum deposition or spin coating, the deposition conditions and the coating conditions can vary according to the compound used as a material for the electron transporting layer (ETL). However, in general, the deposition conditions and the coating conditions are determined in the same ranges as applied to form the hole injecting layer (HIL). Any common material that can stably transport electrons injected from an electron injecting electrode (cathode), for example, tris(8-quinolinolate) aluminum (Alq3), TAZ, Balq, etc., can be used for the electron transporting layer (ETL).

The thickness of the electron transporting layer (ETL) can be in a range of 100-1,000 Å, preferably, 200-500 Å. When the thickness of the electron transporting layer (ETL) is less than 100 Å, the electron transport characteristics may deteriorate. When the thickness of the electron transporting layer (ELT) exceeds 1,000 Å, the driving voltage rises.

In addition, an electron injecting layer (EIL), which allows electrons to be easily injected from the cathode, may be formed on the electron transporting layer (ETL). Any materials which are known as materials for the electron injecting layer (EIL), for example, LiF, NaCl, CsF, Li2O BaO, etc., can be used. The electron injecting layer (EIL) can be formed, for example, vacuum deposition. The deposition conditions can vary according to the compound used as a material for the electron injecting layer (EIL). The deposition rate can be in a range of 0.01-1 Å/s, preferably, 0.1-0.5 Å/s. When the deposition rate is less than 0.01 Å/s, an accurate thickness is not guaranteed, and the deposition time increases. When the deposition rate exceeds 1 Å/s, It is difficult to control the thickness of the electron injecting layer (EIL).

The thickness of the electron injecting layer (EIL) can be in a range of 1-500 Å, preferably, 5-50 Å. When the thickness of the electron injecting layer (EIL) is less than 1 Å, the electron injection characteristics may deteriorate. When the thickness of the electron injecting layer (EIL) exceeds 500 Å, the driving voltage rises.

Finally, a second electrode is formed on the electron injecting layer (EIL) using vacuum deposition, sputtering, etc. The second electrode can be used as a cathode. Examples of a material for the second electrode include a metal having a low work function, an alloy thereof, an electrically conductive compound, a combination thereof, etc. Examples of the material for the second electrode include, but are not limited to, lithium (Li), magnesium (Mg), barium (Ba), aluminum (Al), aluminum-lithium (Al—Li), aluminum-barium (Al—Ba), calcium (Ca), magnesium-indium (Mg—In), magnesium-silver (Mg—Ag), etc. The second electrode can have a single-layered structure, a multi-layered structure, or other various structures. In a front emission light-emitting device, a transmissive cathode formed using ITO, IZO, etc., can be used.

Hereinafter, the present invention will be described in greater detail with reference to the following examples. The following examples are for illustrative purposes only and are not intended to limit the scope of the invention.

EXAMPLES

Synthesis Example 1

Synthesis of Compound A of Formula 2a

After 7.194 mmol (10.0 g) of octa(chlorosilylethyl)-POSS (polyhedral oligomeric silsesquioxane) was diluted with 500 mL of tetrahydrofuran, 63.310 mmol (6.41 g) of triethylamine was added. Next, the reaction temperature was lowered to −78° C., 63.310 mmol (2.03 g) of methanol was slowly added, and the reaction temperature was slowly raised to room temperature. After the reaction was allowed at room temperature for 20 hours, the reaction product was filtered through a Celite filter, and a volatile substance was removed under a reduced pressure of about 0.1 Torr. 100 mL of pentane was added to the product, stirred for 1 hour, and filtered through a Celite filter to obtain a colorless, clear solution. The pentane was removed from the solution under a reduced pressure of about 0.1 Torr to obtain a compound of Formula (2a). The synthesized compound was dissolved in $CDCl_3$ and analyzed using NMR. The results are as follows:

1H NMR(300 MHz) data; δ0.11(s, 48H, 8×[$CH_3$]2), 0.54~0.68(m, 32H, 8×$CH_2CH_2$—), 3.43(s, 24H, 8×$OCH_3$—).

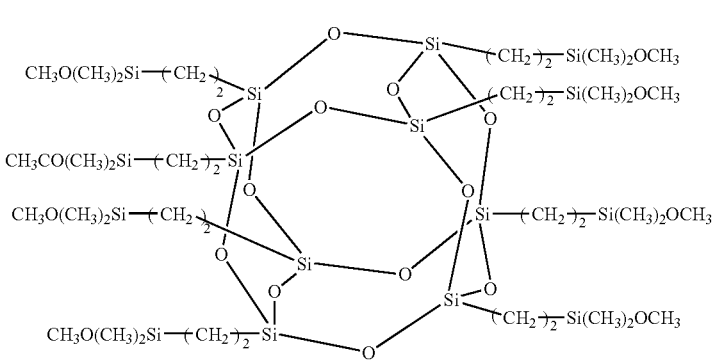

(2a)

The compound of Formula (2a) is referred to as Compound A.

Synthesis Example 2

Synthesis of Compound B of Formula (3a)

29.014 mmol (10.0 g) of 2,4,6,8-tetramethyl-2,4,6,8-tetravinyl cyclotetrasiloxane and 0.164 g of platinum(0)-1,3-divinyl-1,1,3,3-tetramethyldisiloxane complex dissolved in a xylene solution were put into a flask and diluted with 300 mL of diethylether. The temperature of the flask was lowered to −78° C., 127.66 mmol (17.29 g) of trichlorosilane was slowly added, and the reaction temperature was slowly raised to room temperature. After the reaction was allowed at room temperature for 20 hours, a volatile substance was removed under a ii reduced pressure of about 0.1 Torr. 100 mL of pentane was added to the product, stirred for 1 hour, and filtered through a Celite filter to obtain a solution. The pentane was removed from the solution under a reduced pressure of about 0.1 Torr to obtain a liquid compound of Formula below.

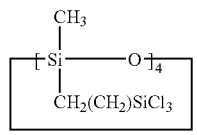

11.28 mmol (10.0 g) of the liquid compound was diluted with 500 mL of tetrahydrofuran, and 136.71 mmol (13.83 g) of triethylamine was added. Subsequently, the reaction temperature was lowered to −78° C., 136.71 mmol (4.38 g) of methanol was slowly added, and the reaction temperature was slowly raised to room temperature. After the reaction was allowed at room temperature for 15 hours, the reaction product was filtered through a Celite filter, and a volatile substance was removed under a reduced pressure of about 0.1 Torr. 100 mL of pentane was added to the product, stirred for 1 hour, and filtered through a Celite filter to obtain a colorless, clear solution. The pentane was removed from the solution under a reduced pressure of about 0.1 Torr to obtain a compound of Formula (3a) below.

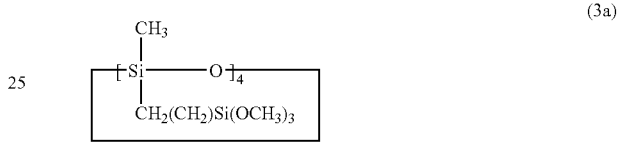

(3a)

The compound of Formula (3a) was dissolved in CDCl$_3$ and analyzed using NMR. The results are as follows:

1H-NMR(300 MHz): δ 0.09(s, 12H, 4×—CH$_3$), 0.52~0.64 (m, 16H, 4×—CH$_2$CH$_2$—), 3.58(s, 36H, 4×—[OCH$_3$]$_3$).

The compound of Formula (3a) is referred to as Compound B.

Synthesis Example 3

Synthesis of Compound C of Formula (4a)

249.208 mmol (10.0 g) of 1,3-dichlorotetramethyldisiloxane was put into a flask and diluted with 500 mL of tetrahydrofuran. The temperature of the flask was lowered to −78° C., 108.212 mmol (10.95 g) of triethylamine was added, 107.990 mmol (3.46 g) of methanol was slowly added, and the reaction temperature was slowly raised to room temperature. After the reaction was allowed at room temperature for 15 hours, the reaction product was filtered through a Celite filter, and a volatile substance was removed under a reduced pressure of about 0.1 Torr. 100 mL of hexane was added to the product, stirred for 1 hour, and filtered through a Celite filter to obtain a solution. The hexane was removed from the solution under a reduced pressure of about 0.1 Torr. A resulting colorless, liquid was subjected to simple distillation to obtain a compound of Formula (4a) below in colorless liquid form.

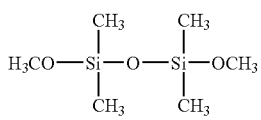

(4a)

The compound of Formula (4a) was dissolved in CDCl$_3$ and analyzed using NMR. The results are as follows:

1H NMR(300 MHz) data; δ0.068(s, 12H, 4×—CH$_3$), 3.45 (s, 6H, 2×—OCH$_3$).

The compound of Formula (4a) is referred to as Compound C.

Synthesis Example 4

Synthesis (I) of Siloxane Material

At least one of Compound A of Formula (2a) having a cage structure obtained in Synthesis Example 1, Compound B of Formula (3a) having a cyclic structure obtained in Synthesis Example 2, Compound C of Formula (4a) having a linear structure obtained in Synthesis Example 3, tetramethoxysilane (available from Aldrich Co., referred to as "Compound D" of Formula (6a)), and methyltrimethoxysilane (available from Aldrich Co., referred to as "Compound E" of Formula (6b)) were weighted as described in Table 1 below and respectively put into 8 flasks. Tetrahydrofuran of 15 times of the amount of the compound put into each flask was put into each of the flasks, the inner temperatures of the flasks were lowered to −78° C., predetermined amounts of HCl and water were put into each of the flasks at −78° C., and the temperatures of the flasks were slowly raised to 70° C. After the reaction at 70° C. for 20 hours, the reaction solution in each of the flasks was transferred to a separatory funnel, equal amounts of diethylether and tetrahydrofuran to the amount of the initially added tetrahydrofuran were added, followed by washing 3 times with water of 1/10 times of the total amount of the solvent. A volatile substance was removed under a reduced pressure to obtain a polymer in white powder form. The polymer obtained through the above-described processes was dissolved in a small amount of acetone to obtain a clear solution. The resulting solution was filtered through a filter having a pore size of 0.2 µm to remove fine powder and other foreign substances and take only a clear liquid fraction. Water was slowly added into the liquid fraction. The resulting white powder was separated from the solution fraction (mixture of acetone and water) and dried at 0-20° C. and a reduced pressure of 0.1 Torr for 10 hours, thereby resulting in siloxane materials 1 through 8. The amounts of the compounds, acid catalyst and water used to synthesize the siloxane materials 1 through 8 and the amounts of the siloxane materials 1 through 8 are shown in Table 1.

TABLE 1

| Siloxane material No. | Compound (mmol) | | | | | HCl(mmol) | H$_2$O(mmol) | Amount of Siloxane material (g) |
|---|---|---|---|---|---|---|---|---|
| | A | B | C | D | E | | | |
| 1 | | 9.85 | | | | 1.18 | 394 | 5.35 |
| 2 | | | | | 10.0 | 0.31 | 540 | 3.24 |
| 3 | | 15.45 | 5.142 | | | 0.15 | 514 | 6.85 |
| 4 | 1.20 | 10.79 | | | | 1.59 | 532 | 4.51 |
| 5 | | 13.28 | | 2.39 | | 1.59 | 529 | 6.15 |
| 6 | | 3.790 | | | 37.86 | 0.16 | 529 | 5.51 |
| 7 | 1.20 | 10.79 | 5.14 | | | 1.59 | 532 | 5.37 |
| 8 | 1.20 | 9.598 | 5.14 | 1.20 | | 1.49 | 496 | 4.76 |

The molecular weight, Si—OH content, Si—OCH$_3$ content, and Si—CH$_3$ content in each of the siloxane materials 1 through 8 are shown in Table 2 below.

TABLE 2

| Siloxane material No. | Molecular Weight (MW) | Molecular Weight Distribution (MWD) | Si—OH(%) | Si—OCH$_3$(%) | Si—CH$_3$(%) |
|---|---|---|---|---|---|
| 1 | 60800 | 6.14 | 35.0 | 1.2 | 63.8 |
| 2 | 25300 | 3.21 | 35.0 | 1.5 | 63.5 |
| 3 | 45120 | 5.12 | 28.6 | 0.7 | 70.7 |
| 4 | 48920 | 6.30 | 18.5 | 1.5 | 80.0 |
| 5 | 4020 | 2.77 | 39.8 | 0.5 | 59.7 |
| 6 | 63418 | 6.13 | 26.3 | 0.7 | 73.0 |
| 7 | 60452 | 8.70 | 17.2 | 0.8 | 82.0 |
| 8 | 54213 | 7.86 | 21.6 | 2.0 | 76.4 |

※ MW was analyzed using gel permeation chromatography (Waters Co.)

※ Si—OH content, Si—OCH$_3$ content, and Si—CH$_3$ content were analyzed using NMR (Bruker Co) and calculated using the following equations.

Si—OH(%)=Area(Si—OH)÷Area(Si—OH)+Area(Si—OCH$_3$)/3+Area(Si—CH$_3$)/3]×100,

Si—OCH$_3$(%)=Area(Si—OCH$_3$)/3÷Area(Si—OH)+Area(Si—OCH$_3$)/3+Area(Si—CH$_3$)/3]×100, Si—CH$_3$(%)=Area(Si—CH$_3$)/3÷Area(Si—OH)+Area(Si—OCH$_3$)/3+Area(Si—CH$_3$)/3]×100.

Synthesis Example 5

Synthesis (II) of Compound (Siloxane Material 9) of Formula (2b)

Synthesis of Intermediate B

Intermediate B was synthesized according to Reaction scheme 1 below.

Reaction Scheme (1)

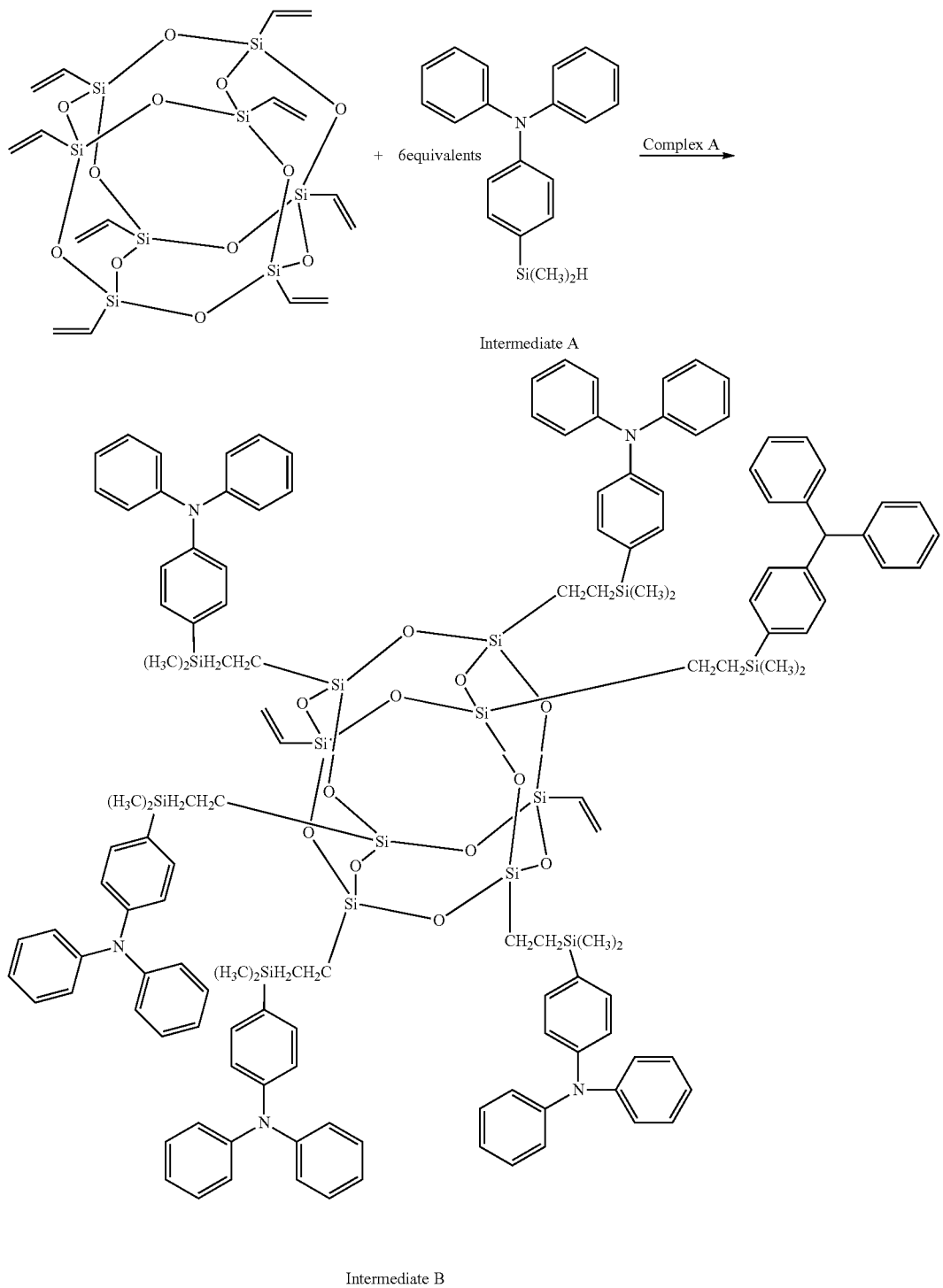

Intermediate B 1 g (1.57 mmol) of octavinyl polyhedral oligomeric silsesquioxane (POSS) and 0.164 g of Complex A, platinum(0)-1,3-divinyl-1,1,3,3-tetramethyldisiloxane complex (solution in xylene) were put into a flask and diluted with 300 mL of diethylether. Next, the temperature of the flask was lowered to −78° C., 6 equivalents of Intermediate A was slowly added, and the reaction temperature was slowly raised to room temperature. After the reaction was allowed at room temperature for 20 hours, a volatile substance was removed under a reduced pressure of about 0.1 Torr. 100 mL of pentane was added, stirred for 1 hour, and filtered through a Celite filter to obtain a solution. The pentane was removed from the solution in a reduced pressure of about 0.1 Torr to obtain Intermediate B.

added, and the reaction temperature was slowly raised to room temperature. After the reaction was allowed at room temperature for 20 hours, a volatile substance was removed under a reduced pressure of about 0.1 Torr. 100 mL of pentane was added, stirred for 1 hour, and filtered through a Celite filter to obtain a solution. The pentane was removed from the solution in a reduced pressure of about 0.1 Torr. The resulting compound was dissolved with 100 mL of tetrahydrofuran (THF), triethylamine was added to the solution, 10 equivalents of ethanol was slowly added to the solution, and reacted at room temperature for 10 hours. The reaction product was filtered through a Celite filter to obtain a solution. The solvent was removed from the solution under a reduced pressure of

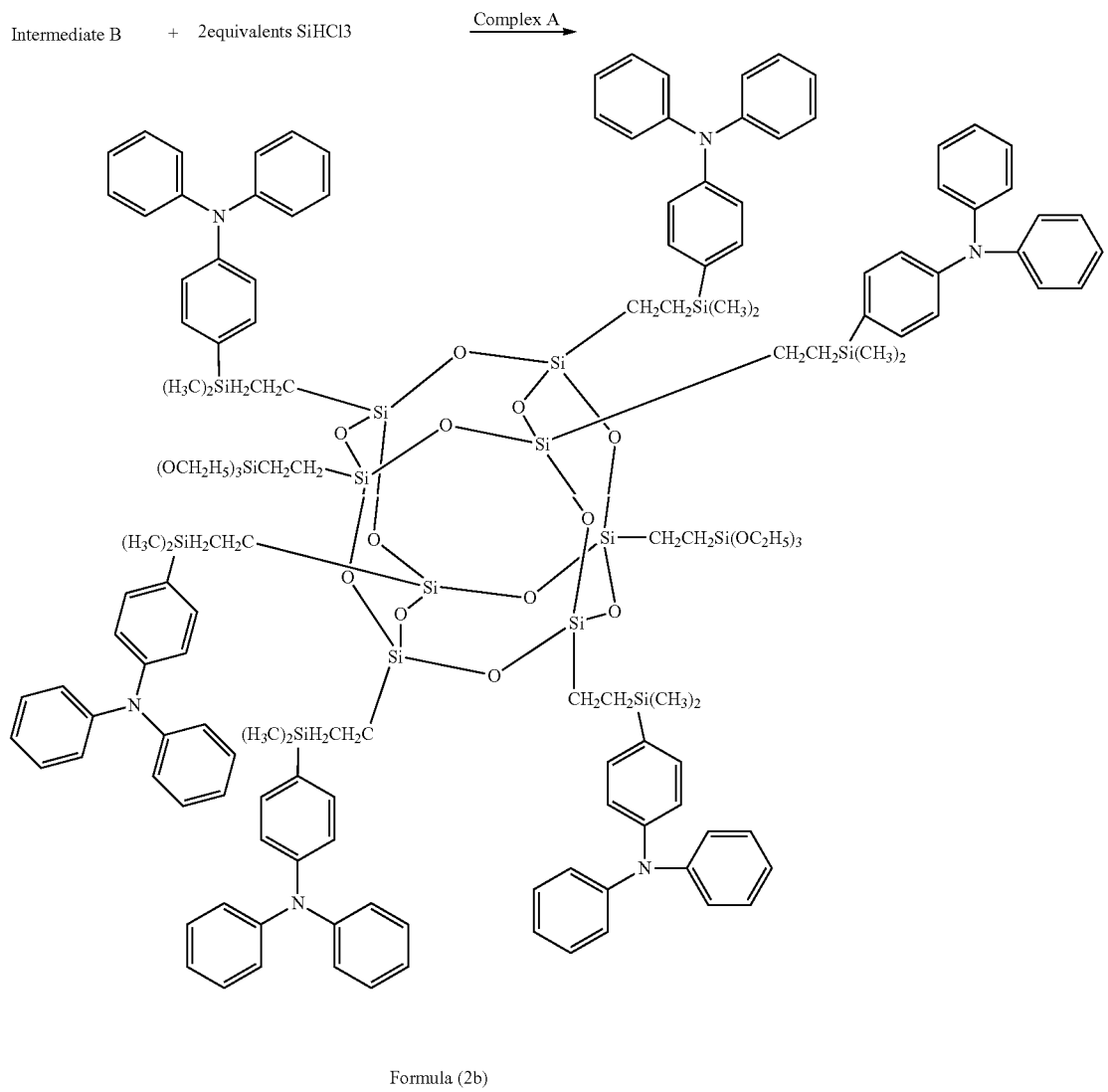

Formula (2b)

Reaction Scheme (2)

Intermediate B and 0.164 g of Complex A, platinum(0)-1,3-divinyl-1,1,3,3-tetramethyldisiloxane complex (solution in xylenes), were put into a flask and diluted with 300 mL of diethylether. Next, the temperature of the flask was lowered to −78° C., 2 equivalents of trichlorosilane ($SiHCl_3$) was slowly about 0.1 Torr to obtain a compound of Formula (2b). The compound of Formula (2b) was analyzed using NMR. The results are as follows:

1H-NMR (300 MHz, $CDCl_3$) d (ppm) 0.1(Si—($CH_3$)$_2$), 0.4(POSS—$CH_2CH_2$Si), 0.54(POSS—$CH_2CH_2$Si), 1.06 (Si—$OCH_2CH_3$), 3.67(Si—$OCH_2CH_3$), 6.8-7.08(N-Phenyl)

The compound of Formula (2a) is referred to as siloxane material 9.

Example 1

An organic light-emitting device including a hole injecting layer obtained using a conducting polymer composition containing PEDOT-PSS (Poly(3,4-ethylene dioxythiophene)/Poly(4-styrenesulfonate)) as a conducting polymer and acid, and siloxane material 1 obtained in Synthesis Example 4 was manufactured. The organic light-emitting device had a structure of IZO/PEDOT-PSS+ siloxane material 1 (500 Å)/Dow Green K2(Lumation 1300) (800 Å)/Ba (50 Å) Al (1500 Å).

An anode was manufactured by cutting an IZO glass substrate (15Ω/cm², 1,000 Å) into a size of 50 mm×50mm× 0.7mm, ultrasonicating the cut substrate in acetone isopropyl alcohol and then in pure water for 15 minutes each, and UV-ozone washing it for 30 minutes. PEDOT-PSS as a conducting polymer and acid with the product name of Baytron® P ET V2 (poly(3,4-ethylenedioxythiophene) poly(styrenesulfonate) aqueous dispersion) (available from H C. Starch, and GmbH Co., mixed solution of water and alcohol with a 1:16 weight ratio of PEDOT and PSS), and siloxane material 1 were dissolved in dimethylformamide (DMF) to prepare a conducting polymer composition. The weight ratio of PEDOT-PSS and siloxane material 1 was 97:3. The conducting polymer composition was spin-coated on a substrate at 2,000 rpm and thermally treated in air at 200° C. for 5 minutes to form a hole injecting layer having a thickness of 500 Å. 1.2 Wt % of Dow Green K2 (available from Dow Chemical Co., Product Name: Lumation 1300) dissolved in toluene was spin-coated as a green emission material on the hole injecting layer at 2,000 rpm and thermally treated at 100° C. for 15 minutes to form an emitting layer having a thickness of 800 Å. Next, a cathode was formed by sequentially depositing Ba and Al on the emitting layer to 50 Å and 1500 Å, respectively, thereby resulting in an organic light-emitting device. This organic light-emitting device was referred to as Sample 1.

Example 2

An organic light-emitting device having a structure of IZO/PEDOT-PSS+ siloxane material 2 (500 Å)/DowGreen K2(Lumation 1300) (800 Å)/Ba (50 Å) Al (1500 Å) was manufactured in the same manner as in Example 1, except that siloxane material 2 obtained in Synthesis Example 4, instead of siloxane material 1, was used. This organic light-emitting device was referred to as Sample 2.

Example 3

An organic light-emitting device having a structure of IZO/PEDOT-PSS+ siloxane material 3 (500 Å)/DowGreen K2(Lumation 1300) (800 Å)/Ba (50 Å) Al (1500 Å) was manufactured in the same manner as in Example 1, except that siloxane material 3 obtained in Synthesis Example 4, instead of siloxane material 1, was used. This organic light-emitting device was referred to as Sample 3.

Example 4

An organic light-emitting device having a structure of IZO/PEDOT-PSS+ siloxane material 4 (500 Å)/DowGreen K2(Lumation 1300) (800 Å)/Ba (50 Å) Al (1500 Å) was manufactured in the same manner as in Example 1, except that siloxane material 4 obtained in Synthesis Example 4, instead of siloxane material 1, was used. This organic light-emitting device was referred to as Sample 4.

Example 5

An organic light-emitting device having a structure of IZO/PEDOT-PSS+ siloxane material 5 (500 Å)/DowGreen K2(Lumation 1300) (800 Å)/Ba (50 Å) Al (1500 Å) was manufactured in the same manner as in Example 1, except that siloxane material 5 obtained in Synthesis Example 4, instead of siloxane material 1, was used. This organic light-emitting device was referred to as Sample 5.

Example 6

An organic light-emitting device having a structure of IZO/PEDOT-PSS+ siloxane material 6 (500 Å)/DowGreen K2(Lumation 1300) (800 Å)/Ba (50 Å) Al (1500 Å) was manufactured in the same manner as in Example 1, except that siloxane material 6 obtained in Synthesis Example 4, instead of siloxane material 1, was used. This organic light-emitting device was referred to as Sample 6.

Example 7

An organic light-emitting device having a structure of IZO/PEDOT-PSS+ siloxane material 7 (500 Å)/DowGreen K2(Lumation 1300) (800 Å)/Ba (50 Å) Al (1500 Å) was manufactured in the same manner as in Example 1, except that siloxane material 7 obtained in Synthesis Example 4, instead of siloxane material 1, was used. This organic light-emitting device was referred to as Sample 7.

Example 8

An organic light-emitting device having a structure of IZO/PEDOT-PSS+ siloxane material 8 (500 Å)/DowGreen K2(Lumation 1300) (800 Å)/Ba (50 Å) Al (1500 Å) was manufactured in the same manner as in Example 1, except that siloxane material 8 obtained in Synthesis Example 4, instead of siloxane material 1, was used. This organic light-emitting device was referred to as Sample 8.

Example 9

An organic light-emitting device having a structure of IZO/PEDOT-PSS+ siloxane material 9 (500 Å)/DowGreen K2(Lumation 1300) (800 Å)/Ba (50 Å) Al (1500 Å) was manufactured in the same manner as in Example 1, except that siloxane material 9 obtained in Synthesis Example 4, instead of siloxane material 1, was used. This organic light-emitting device was referred to as Sample 9.

Comparative Example 1

An organic light-emitting device having a structure of IZO/DowGreen K2(Lumation 1300) (800 Å)/Ba (50 Å) Al (1500 Å) was manufactured in the same manner as in Example 1, except that no hole injecting layer was formed. This organic light-emitting device was referred to as Comparative Sample A.

Comparative Example 2

An organic light-emitting device having a structure of IZO/PEDOT-PSS (500 Å)/DowGreen K2(Lumation 1300) (800 Å)/Ba (50 Å) Al (1500 Å) was manufactured in the same manner as in Example 1, except that the hole injecting layer was formed using only PEDOT-PSS. This organic light-emitting device was referred to as Comparative Sample B.

Evaluation Example 5

The turn-on voltage, color purity, brightness, and maximum luminous efficiency were measured on Samples 1 through 9 and Comparative Samples A and B using Keithley Source Measurement Unit 238 and PR650 (Spectroscan) Source Measurement Unit, and the lifetime of each of the samples was measured using McScience Lifetime Tester Polaronix® M6000. The results are shown in Table 3. The brightness ($cd/m^2$) was measured at 6V, CIE chromaticity coordinates were read at 1,000 $cd/m^2$, and the lifetime was measured as the time which takes for an initial brightness of 1,000 $cd/M^2$ to reduce by half. The voltage-current density graphs, voltage-brightness ($cd/m^2$) graphs, and time-brightness (%) graphs of Samples 9, A, and B are shown in FIGS. 2 through 4.

TABLE 3

| Sample No. | Turn-on Voltage (V) | CIE coordinates (1,000 $cd/m^2$) | Brightness at 6 V ($cd/m^2$) | Maximum Efficiency (cd/A) | Lifetime at 1,000 $cd/m^2$ (h) |
|---|---|---|---|---|---|
| Sample 1 | 2.2 | 0.40, 0.57 | 3008 | 15.6 | 119 |
| Sample 2 | 2.2 | 0.40, 0.57 | 3050 | 16.0 | 109 |
| Sample 3 | 2.2 | 0.40, 0.57 | 2950 | 15.3 | 110 |
| Sample 4 | 2.2 | 0.40, 0.57 | 2790 | 14.8 | 105 |
| Sample 5 | 2.2 | 0.40, 0.57 | 2890 | 15.1 | 101 |
| Sample 6 | 2.2 | 0.40, 0.57 | 2790 | 14.9 | 108 |
| Sample 7 | 2.2 | 0.40, 0.57 | 2560 | 14.5 | 102 |
| Sample 8 | 2.2 | 0.40, 0.57 | 3050 | 16.5 | 121 |
| Sample 9 | 2.2 | 0.40, 0.57 | 3104 | 15.9 | 112 |
| Comparative Sample A | 2.5 | 0.40, 0.57 | 35 | 0.30 | <1 |
| Comparative Sample B | 2.4 | 0.40, 0.57 | 1199 | 11.2 | 70 |

Figure 2:
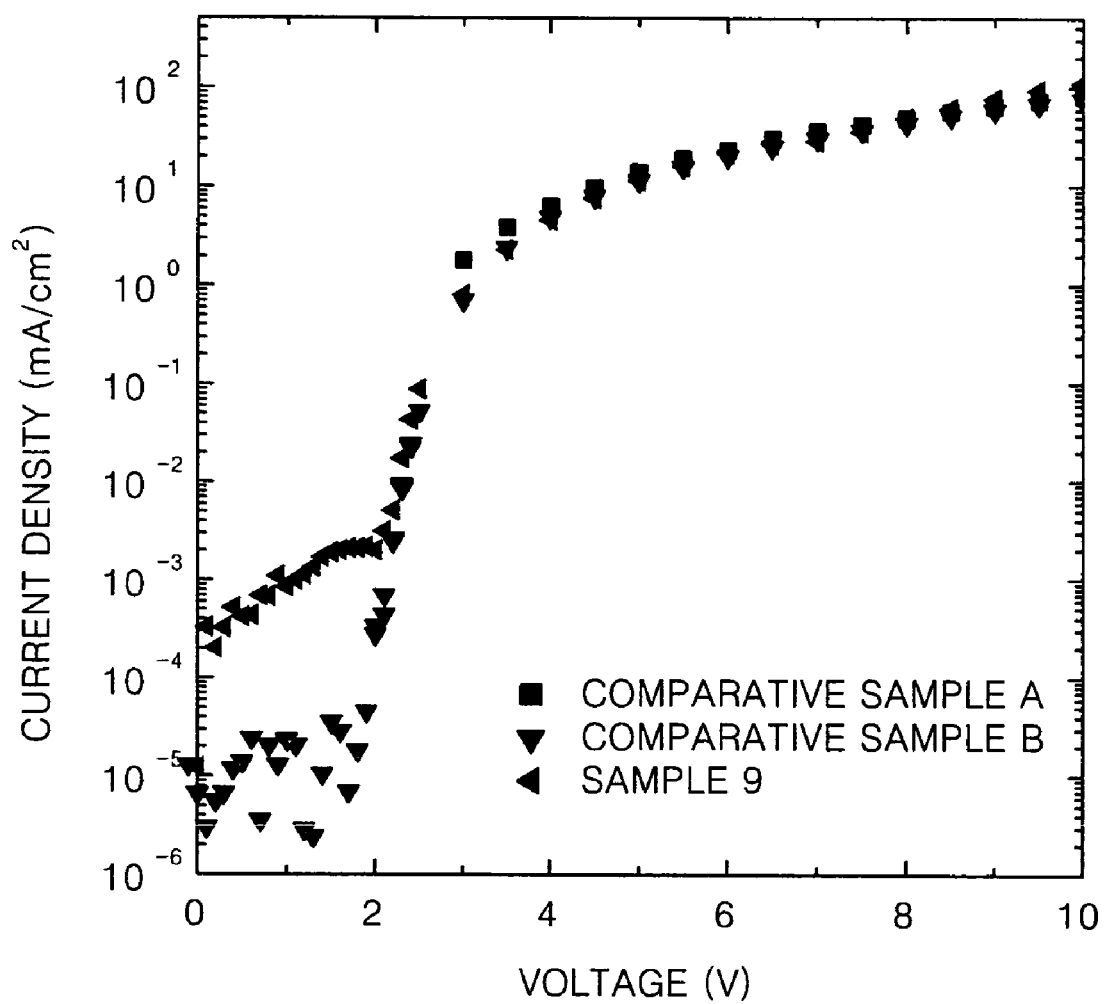
FIG. 2 is a graph of voltage versus current density of conventional organic light-emitting devices and an organic light-emitting device as an electronic device according to an example of the present invention.
Figure 3:
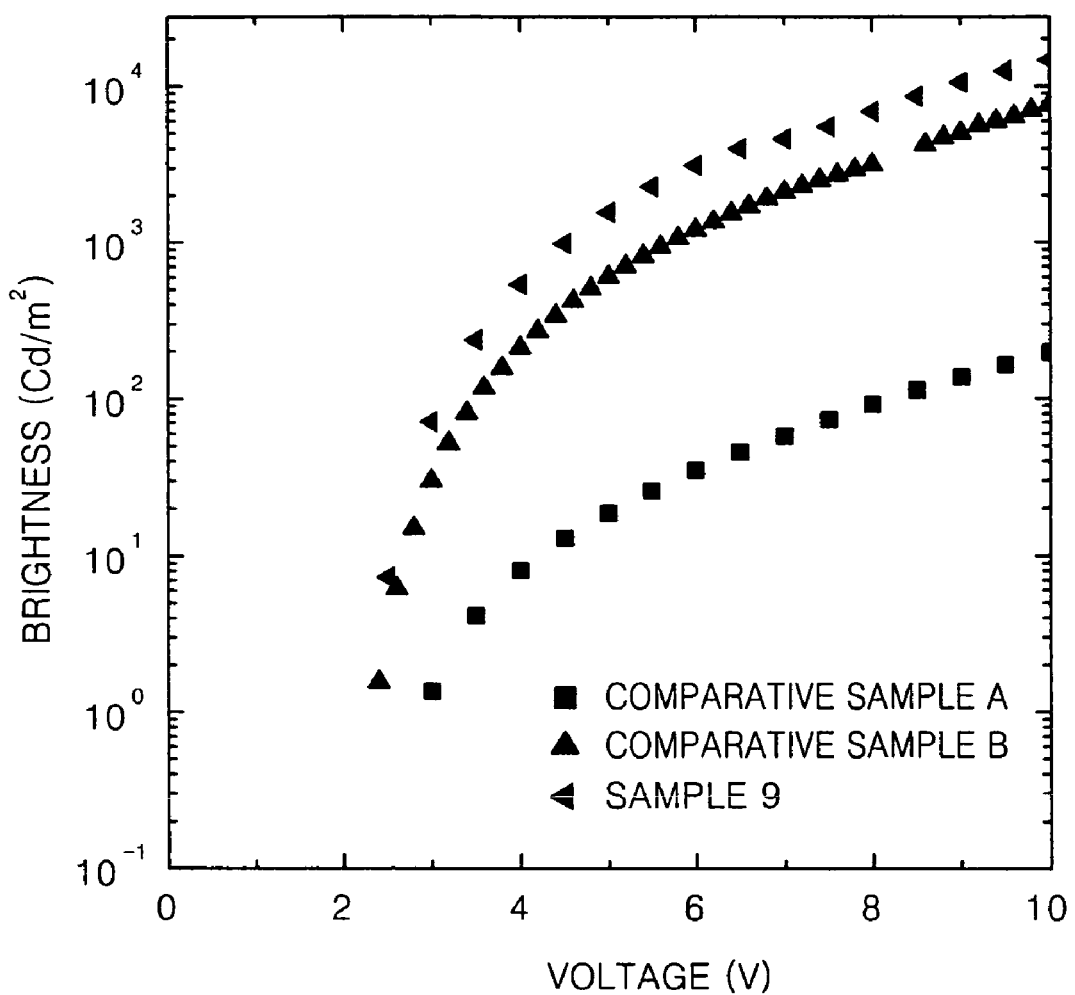
FIG. 3 is a graph of voltage versus brightness of the conventional organic light-emitting devices and the organic light-emitting device as an electronic device according to an example of the present invention.
Figure 4:
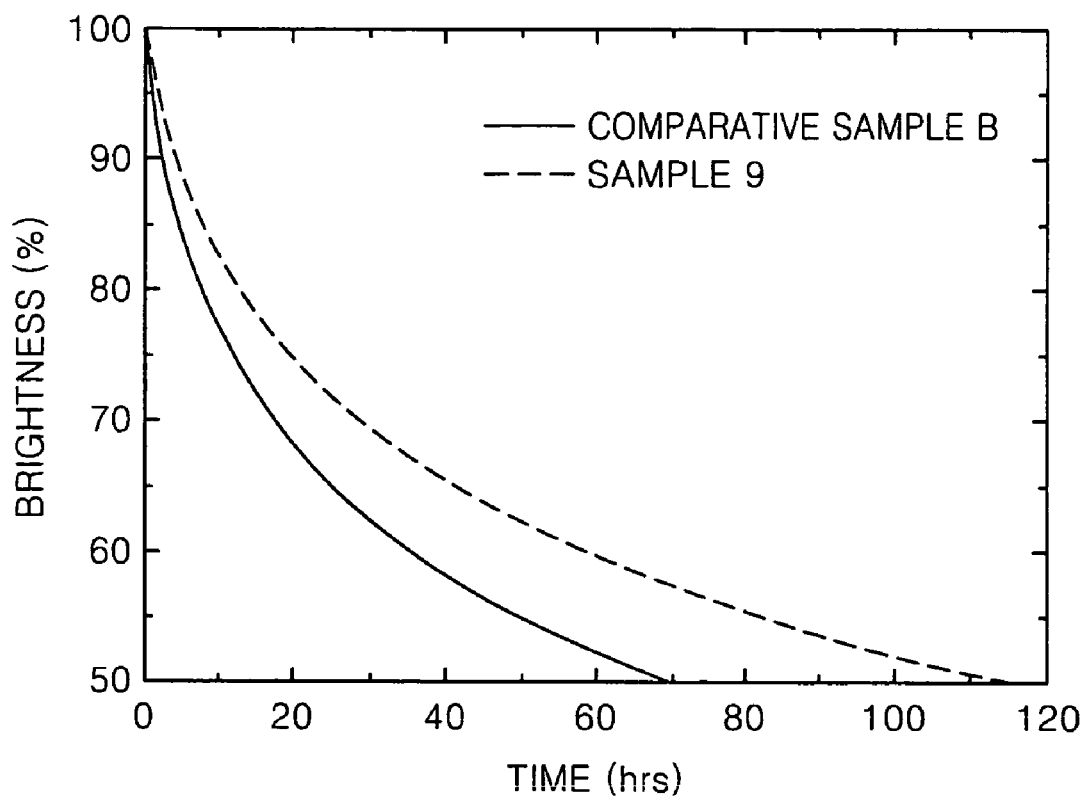
FIG. 4 is a graph of time versus brightness of a conventional organic light-emitting device and the organic light-emitting device as an electronic device according to an example of the present invention.

As is apparatus from Table 3 and FIGS. 2 through 4, Samples 1 through 9 according to the present invention has excellent electrical characteristics and long lifetimes.

As described above, a conducting polymer composition according to 11 the present invention contains the siloxane compound of Formula (1) and a conducting polymer. A layer obtained using the conducting polymer composition has excellent electrical characteristics and durability due to a network of the compound and the conducting polymer. An electrical device having improved electrical characteristics and longer lifetime can be manufactured using the layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic light-emitting device, comprising:
a first electrode;
a second electrode;
an emitting layer interposed between the first electrode and the second electrode; and
at least one of a hole transporting layer and a hole injecting layer interposed between the emitting layer and the first electrode, said at least one of the hole transporting layer and the hole injecting layer obtained from a conducting polymer composition, the conducting polymer composition, comprising:
a conducting polymer; and
a siloxane material of Formula (1):

where A is selected from the group consisting of a C1-C20 alkyl group, a C6-C30 aryl group, a C1-C20 alkoxy group, a C7-C30 alkylaryl group, a C7-C30 aralkyl group, and —$(CH_2)_n$-$MZ_1Z_2Z_3$ where n is 0 or an integer from 1 to 20, M is Si, Ti, Sn, or Al, and each of $Z_1$, $Z_2$, and $Z_3$ is independently selected from the group consisting of a C1-C20 alkyl group, a C6-C30 aryl group, a C7-C30 alkylaryl group, a C7-C30 aralkyl group, a cross-linkable unit, a hole transport unit, an electron transport unit, and an emissive unit; and
a is an integer from 2 to 1,000.

2. The organic light-emitting device of claim 1, wherein A is —$(CH_2)_n$-$MZ_1Z_2Z_3$, and at least one of $Z_1$, $Z_2$, and $Z_3$ is the cross-linkable unit selected from the group consisting of a hydroxyl group, a C1-C20 alkoxy group, and a halogen atom.

3. The organic light-emitting device of claim 1, wherein A is —$(CH_2)_n$-$MZ_1Z_2Z_3$, and at least one of $Z_1$, $Z_2$, and $Z_3$ is the hole transport unit selected from the group consisting of:

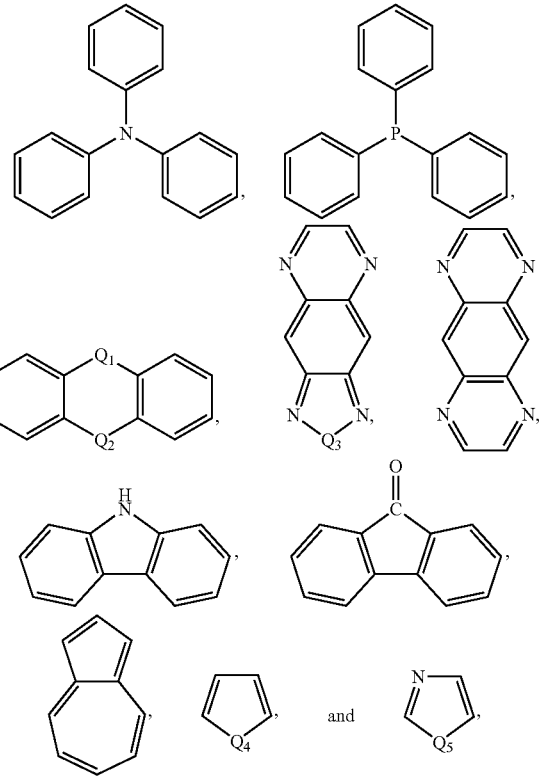

where each of $Q_1$, $Q_2$, $Q_3$, $Q_4$, and $Q_5$ is independently N, O, or S.

4. The organic light-emitting device of claim 1, wherein A is —(CH$_2$)$_n$-MZ$_1$Z$_2$Z$_3$, and at least one of Z$_1$, Z$_2$, and Z$_3$ is the electron transport unit selected from the group consisting of:

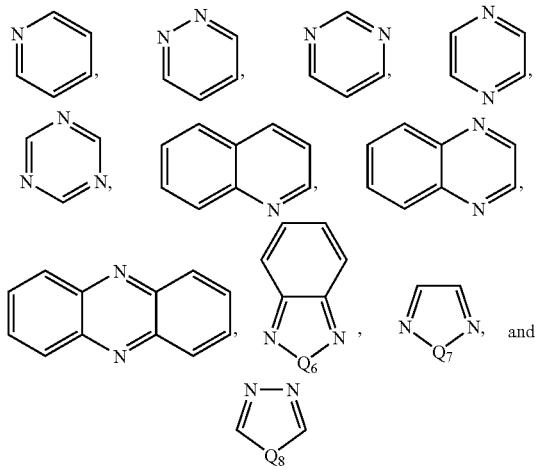

where each of Q$_6$, Q$_7$ and Q$_8$ is independently N, O, or S.

5. The organic light-emitting device of claim 1, wherein A is —(CH$_2$)$_n$-MZ$_1$Z$_2$Z$_3$, and at least one of Z$_1$, Z$_2$, and Z$_3$ is the emissive unit being a C6-C30 aromatic cyclic system or a C5-C30 hetero aromatic cyclic system, which include one or at least two rings which are fused or are bonded by a single bond or a vinylene group.

6. The organic light-emitting device of claim 1, wherein the siloxane material has Formula (2):

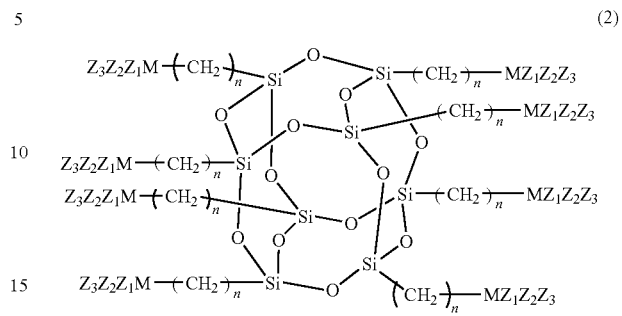

(2)

where n is 0 or an integer from 1 to 20;
M is Si, Ti, Sn, or Al; and
each of Z$_1$, Z$_2$, and Z$_3$ is independently selected from the group consisting of a C1-C20 alkyl group, a C6-C30 aryl group, a C7-C30 alkylaryl group, a C7-C30 aralkyl group, a cross-linkable unit, a hole transport unit, an electron transport unit, and an emissive unit, wherein the eight —(CH$_2$)$_n$MZ$_1$Z$_2$Z$_3$ groups are the same or different.

7. The organic light-emitting device of claim 1, wherein the siloxane material has one of Formulae (2a), (2b), and (2c):

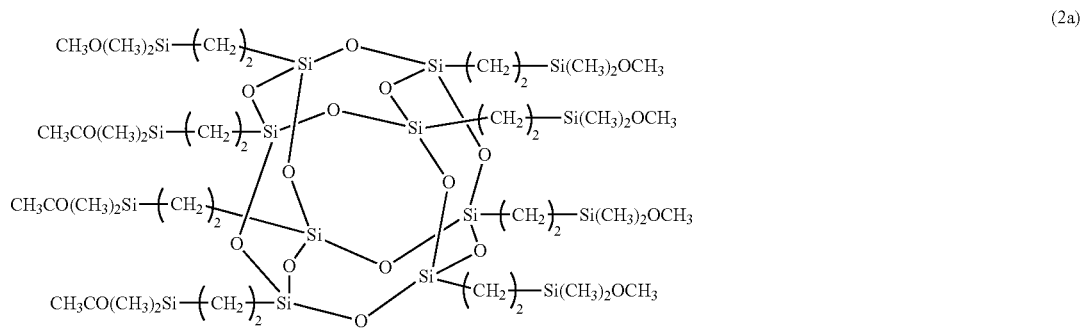

(2a)

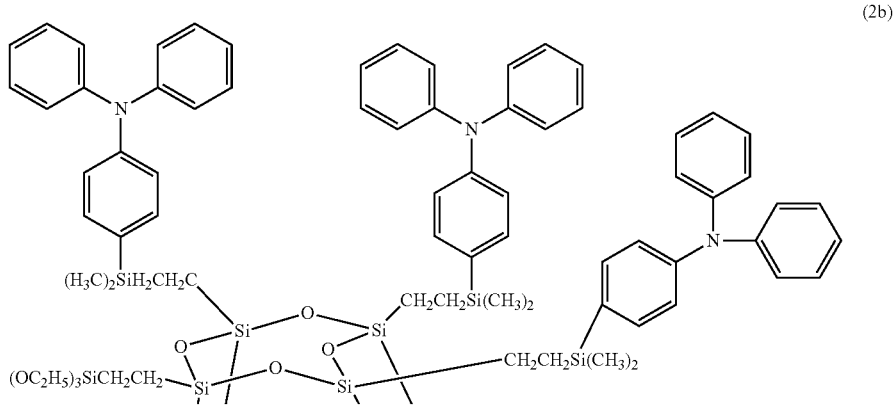

(2b)

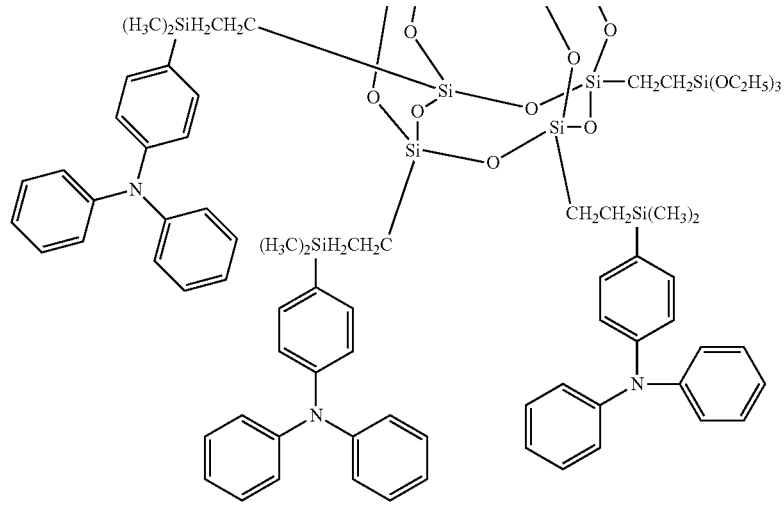
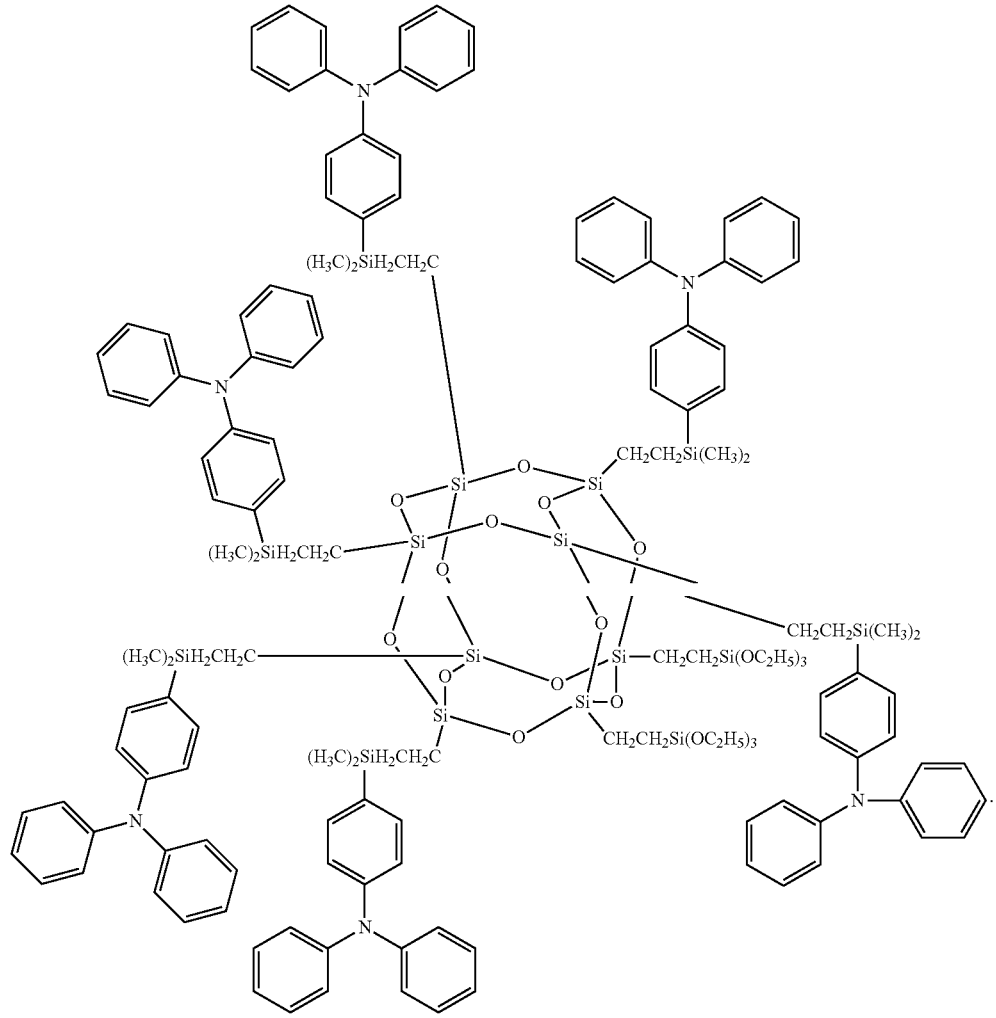
(2c)

8. The organic light-emitting device of claim 1, wherein the weight average molecular weight of the siloxane material of Formula (1) is 500,000 or less.

9. The organic light-emitting device of claim 1, wherein the conducting polymer is selected from the group consisting of polythiophene, polyaniline, polypyrrole, polyacetylene, polyvinylenephenylene, polyphenylene, polyfluorene, poly(ethylenedioxythiophene), poly(arylamine), and a derivative thereof.

10. The organic light-emitting device of claim 1, wherein the siloxane material of Formula (1) and the conducting polymer are contained in a weight ratio of 0.01:99.9 to 20:80.

11. The organic light-emitting device of claim 1, wherein the conducting polymer composition further comprises acid.

12. The organic light-emitting device of claim 11, wherein the acid include at least one of an atom selected from the group consisting of C, S, N, O, Si, F, Cl, and H; and a functional group selected from the group consisting of a hydroxyl group, a C1-C20 alkyl group, a C1-C20 alkoxy group, a halogen atom, a cyano group, a nitro group, a C6-C30 aryl group, a C1-C20 alkylamino group, a C6-C30 aryloxy group, a C6-C30 arylamino group, a C1-C20 alkyl epoxy group, a vinyl group, a C1-C20 alkylmercapto, an acetoxy group, a thiol group, and an imide group.

13. The organic light-emitting device of claim 11, wherein the acid includes organic ions selected from the group consisting of sulfonic acid, phosphonic acid and carboxylic acid, and counter ions selected from the group consisting of H and an alkali metal ion.

14. The organic light-emitting device of claim 1, wherein the conducting polymer composition further comprises a crosslinking agent.

15. The organic light-emitting device of claim 1, wherein the conducting polymer composition further comprises at least one of metal nanoparticles and inorganic nanoparticles.

16. The organic light-emitting device of claim 1, wherein the siloxane material is (i) a compound represented by Formula (2), or (ii) a hydrolysate or a condensate of at least one compound selected from the group consisting of the compound of said Formula (2), a compound of Formula (3), a compound of Formula (4), a compound of Formula (5), and a compound of Formula (6):

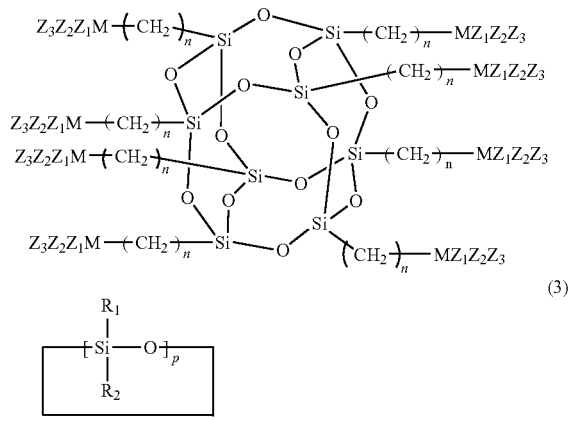

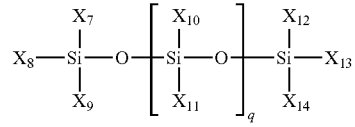

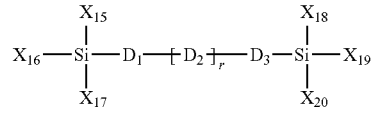

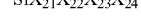

where n is 0 or an integer from 1 to 20;

M is Si, Ti, Sn, or Al;

each of $Z_1$, $Z_2$, and $Z_3$ is independently selected from the group consisting of a C1-C20 alkyl group, a C6-C30 aryl group, a C7-C30 alkylaryl group, a C7-C30 aralkyl group, a cross-linkable unit, a hole transport unit, an electron transport unit, and an emissive unit, wherein the eight —$(CH_2)_n MZ_1Z_2Z_3$ groups are the same or different;

each of $R_1$ and $R_2$ is independently selected from the group consisting of —$CH_2(CH_2)_m SiX_1X_2X_3$, —O—$SiX_4X_5X_6$, a cross-linkable unit, a hole transport unit, an electron transport unit, an emissive unit, hydrogen, a halogen atom, a C1-C20 alkyl group, and a C6-C30 aryl group, wherein at least one of $R_1$ and $R_2$ is —$CH_2(CH_2)_m SiX_1X_2X_3$, —O—$SiX_4X_5X_6$, or a cross-linkable unit;

each of $X_1$, $X_2$, $X_3$, $X_4$, $X_5$, $X_6$, $X_7$, $X_8$, $X_9$, $X_{10}$, $X_{11}$, $X_{12}$, $X_{13}$, $X_{14}$, $X_{15}$, $X_{16}$, $X_{17}$, $X_{18}$, $X_{19}$, $X_{20}$, $X_{21}$, $X_{22}$, $X_{23}$, and $X_{24}$ is independently selected from the group consisting of a cross-linkable unit, a hole transport unit, an electron transport unit, an emissive unit, hydrogen, a halogen atom, and a C1-C20 alkyl group, wherein at least one of $X_1$, $X_2$, and $X_3$, at least one of $X_4$, $X_5$, and $X_6$, at least one of $X_7$, $X_8$, $X_9$, $X_{10}$, $X_{11}$, $X_{12}$, $X_{13}$, and $X_{14}$, at least one of $X_{15}$, $X_{16}$, $X_{17}$, $X_{18}$, $X_{19}$, and $X_{20}$, and at least one of $X_{21}$, $X_{22}$, $X_{23}$, and $X_{24}$ is a cross-linkable unit;

$D_1$ is a single bond or —O—;

$D_2$ is a C1-C20 alkylene group, a C1-C20 alkylene group substituted with at least one halogen atom, —$(CF_2)_b$—O—, a C1-C20 alkylene group substituted with at least one of a hole transport unit, an electron transport unit, or an emissive unit, or a divalent hole transport unit, wherein b is an integer from 1 to 20;

$D_3$ is a single bond, a C1-C20 alkylene group substituted with at least one halogen atom, or a C1-C20 alkylene group;

p is an integer from 3 to 8;

m is an integer from 1 to 10;

q is 0 or an integer from 1 to 10;

r is 0 or an integer from 1 to 10;

$X_{10}$ are the same or different from each other;

$X_{11}$ are the same or different from each other; and $D_2$ are the same or different from each other.

17. The organic light-emitting device of claim 16, wherein the siloxane material is (i) a compound represented by Formula (2), or (ii) the hydrolysate or the condensate of the compound of Formula (3) and optionally at least one compound selected from the group consisting of the compound of Formula (2), the compound of Formula (4), the compound of Formula (5), and the compound of Formula (6), and the compound of Formula (3) is represented by one of Formulae (3a), (3b), (3c), (3d), (3e), (3f), and (3g):

(3a)
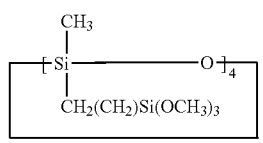

(3b)
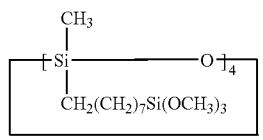

(3c)
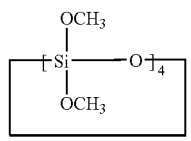

(3d)
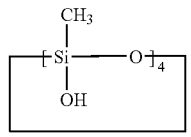

(3e)
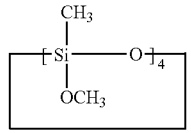

(3f)
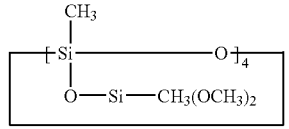

(3g)
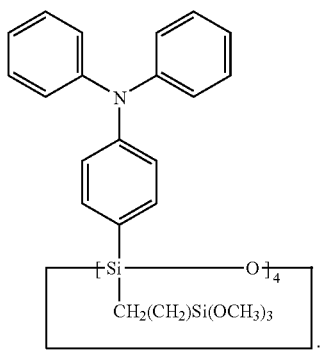

18. The organic light-emitting device of claim 16, wherein the siloxane material is (i) a compound represented by Formula (2), or (ii) the hydrolysate or the condensate of the compound of Formula (4) and optionally at least one compound selected from the group consisting of the compound of Formula (2), the compound of Formula (3), the compound of Formula (5), and the compound of Formula (6), and the compound of Formula (4) is represented by one of Formulae (4a), (4b), (4c), and (4d):

(4a)
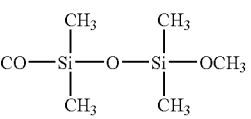

(4b)
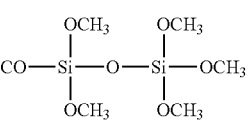

(4c)
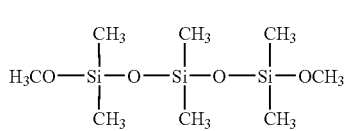

(4d)
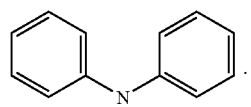
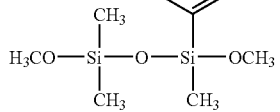

19. The organic light-emitting device of claim 16, wherein the siloxane material is (i) a compound represented by Formula (2), or (ii) the hydrolysate or the condensate of the compound of Formula (5) and optionally at least one compound selected from the group consisting of the compound of Foimula (2), the compound of Formula (3), the compound of Formula (4), and the compound of Formula (6), and the compound of Formula (5) is represented by one of Formulae (5a), (5b), (5c), (5d), (5e), (5f, and (5g):

(5a)
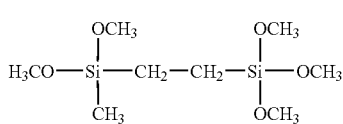

(5b)
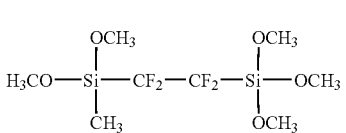

-continued

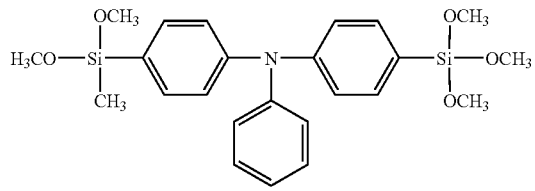 (5c)

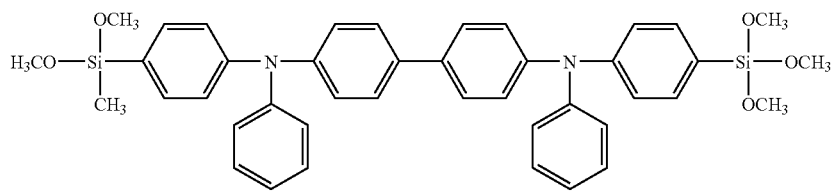 (5d)

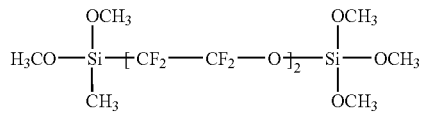 (5e)

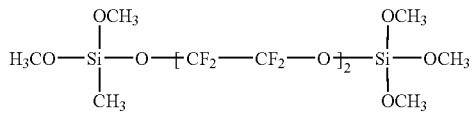 (5f)

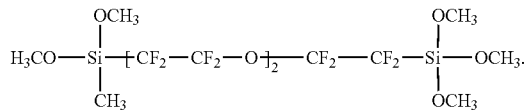 (5g)

20. The organic light-emitting device of claim 16, wherein the siloxane material is (i) a compound represented by Formula (2), or (ii) the hydrolysate or the condensate of the compound of Formula (6) and optionally at least one compound selected from the group consisting of the compound of Formula (2), the compound of Formula (3), the compound of Formula (4), and the compound of Formula (5), and the compound of Formula (6) is represented by one of Formulae (6a) and (6b):

$$Si(OCH_3)_4 \quad (6a)$$

$$SiCH_3(OCH_3)_3 \quad (6b).$$

21. A conducting polymer composition, comprising:
a conducting polymer; and
a siloxane material of Formula (1):

 (1)

wherein A is —$(CH_2)_n$-$MZ_1Z_2Z_3$, and at least one of $Z_1$, $Z_2$, and $Z_3$ is selected from the group consisting of:

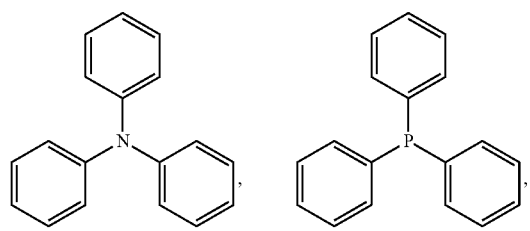

-continued

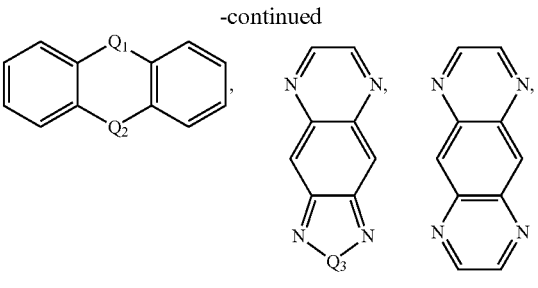

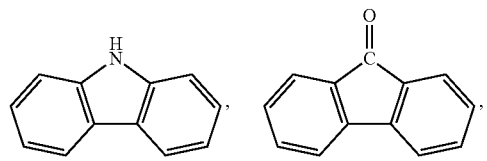

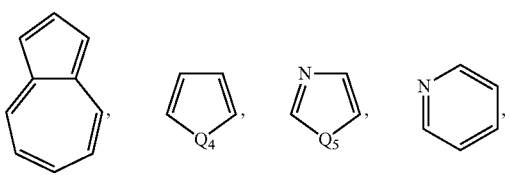

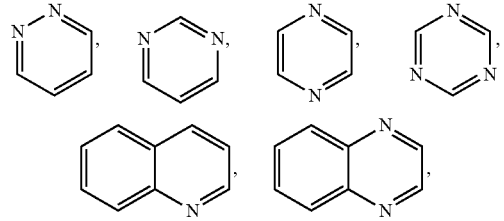

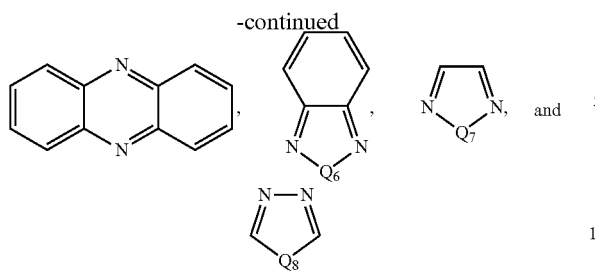

where each of $Q_1$, $Q_2$, $Q_3$, $Q_4$, $Q_5$, $Q_6$, $Q_7$ and $Q_8$ is independently N, O, or S.

22. An electronic device comprising a layer obtained from the conducting polymer composition of claim 21.

23. The electronic device of claim 22, being an organic light-emitting device, wherein the layer is at least one of a hole injecting layer and a hole transporting layer.

24. The conducting polymer composition of claim 21, wherein the siloxane material is (i) a compound represented by Formula (2), or (ii) a hydrolysate or a condensate of at least one compound selected from the group consisting of the compound of said Formula (2), a compound of Formula (3), a compound of Formula (4), a compound of Formula (5), and a compound of Formula (6):

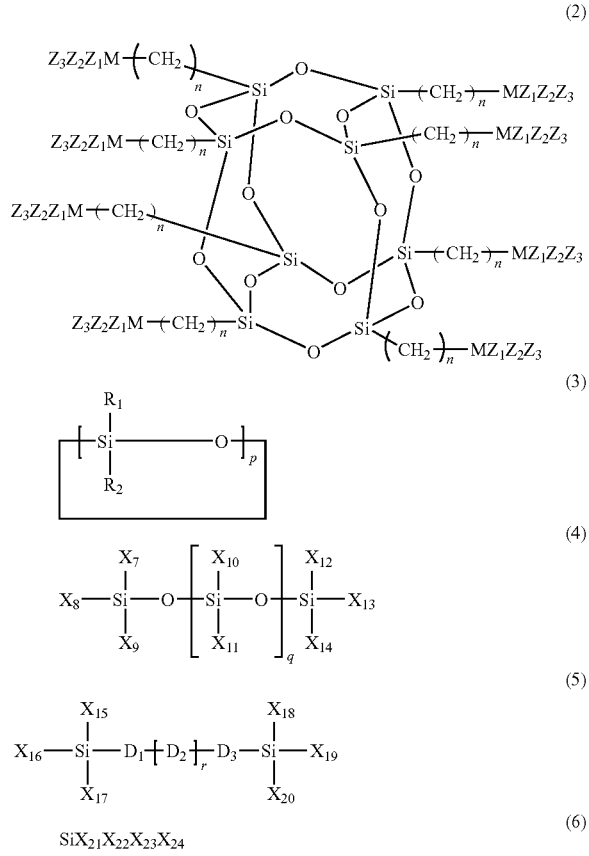

where n is 0 or an integer from 1 to 20;

M is Si, Ti, Sn, or Al;

each of $Z_1$, $Z_2$, and $Z_3$ is independently selected from the group consisting of a C1-C20 alkyl group, a C6-C30 aryl group, a C7-C30 alkylaryl group, a C7-C30 aralkyl group, a cross-linkable unit, a hole transport unit, an electron transport unit, and an emissive unit, wherein the eight —$(CH_2)_nMZ_1Z_2Z_3$ groups are the same or different;

each of $R_1$ and $R_2$ is independently selected from the group consisting of —$CH_2(CH_2)_mSiX_1X_2X_3$, —O—$SiX_4X_5X_6$, a cross-linkable unit, a hole transport unit, an electron transport unit, an emissive unit, hydrogen, a halogen atom, a C1-C20 alkyl group, and a C6-C30 aryl group, wherein at least one of $R_1$ and $R_2$ is —$CH_2(CH_2)_mSiX_1X_2X_3$, —O—$SiX_4X_5X_6$, or a cross-linkable unit;

each of $X_1$, $X_2$, $X_3$, $X_4$, $X_5$, $X_6$, $X_7$, $X_8$, $X_9$, $X_{10}$, $X_{11}$, $X_{12}$, $X_{13}$, $X_{14}$, $X_{15}$, $X_{16}$, $X_{17}$, $X_{18}$, $X_{19}$, $X_{20}$, $X_{21}$, $X_{22}$, $X_{23}$, and $X_{24}$ is independently selected from the group consisting of a cross-linkable unit, a hole transport unit, an electron transport unit, an emissive unit, hydrogen, a halogen atom, and a C1-C20 alkyl group, wherein at least one of $X_1$, $X_2$, and $X_3$, at least one of $X_4$, $X_5$, and $X_6$, at least one of $X_7$, $X_8$, $X_9$, $X_{10}$, $X_{11}$, $X_{12}$, $X_{13}$, and $X_{14}$, at least one of $X_{15}$, $X_{16}$, $X_{17}$, $X_{18}$, $X_{19}$, and $X_{20}$, and at least one of $X_{21}$, $X_{22}$, $X_{23}$, and $X_{24}$ is a cross-linkable unit;

$D_1$ is a single bond or —O—;

$D_2$ is a C1-C20 alkylene group, a C1-C20 alkylene group substituted with at least one halogen atom, —$(CF_2)_b$—O—, a C1-C20 alkylene group substituted with at least one of a hole transport unit, an electron transport unit, or an emissive unit, or a divalent hole transport unit, wherein b is an integer from 1 to 20;

$D_3$ is a single bond, a C1-C20 alkylene group substituted with at least one halogen atom, or a C1-C20 alkylene group;

p is an integer from 3 to 8;

m is an integer from 1 to 10;

q is 0 or an integer from 1 to 10;

r is 0 or an integer from 1 to 10;

$X_{10}$ are the same or different from each other;

$X_{11}$ are the same or different from each other; and $D_2$ are the same or different from each other.

25. The conducting polymer composition of claim 21, wherein the siloxane material is (i) a compound represented by Formula (2), or (ii) the hydrolysate or the condensate of the compound of Formula (3) and optionally at least one compound selected from the group consisting of the compound of Formula (2), the compound of Formula (4), the compound of Formula (5), and the compound of Formula (6), and the compound of Formula (3) is represented by one of Formulae (3a), (3b), (3c), (3d), (3e), (3f), and (3g):

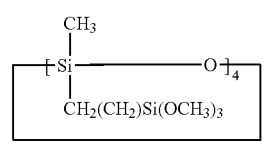

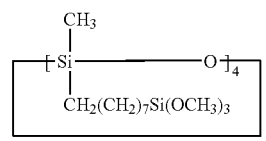

-continued

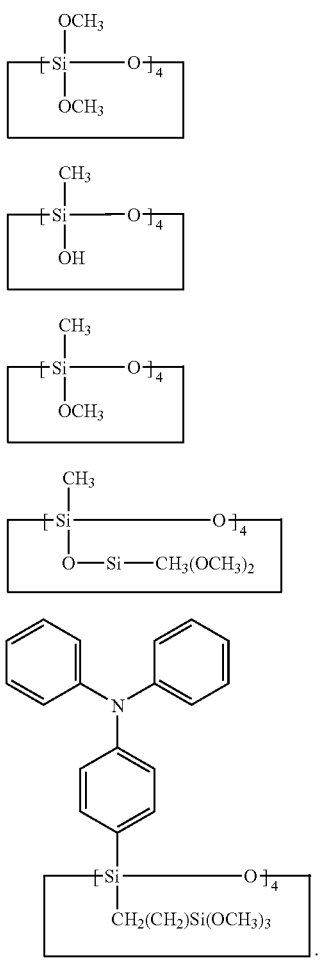

26. The conducting polymer composition of claim 21, wherein the siloxane material is (i) a compound represented by Formula (3), or (ii) the hydrolysate or the condensate of the compound of Formula (4) and optionally at least one compound selected from the group consisting of the compound of Formula (2), the compound of Formula (3), the compound of Formula (5), and the compound of Formula (6), and the compound of Formula (4) is represented by one of Formulae (4a), (4b), (4c), and (4d):

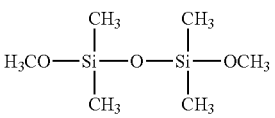 (4a)

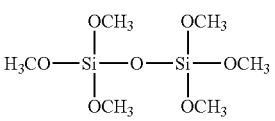 (4b)

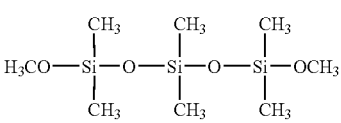 (4c)

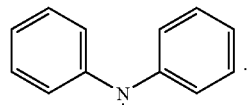 (4d)

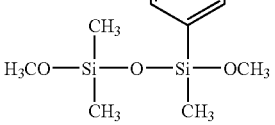

27. The conducting polymer composition of claim 21, wherein the siloxane material is (i) a compound represented by Formula (2), or (ii) the hydrolysate or the condensate of the compound of Formula (5) and optionally at least one compound selected from the group consisting of the compound of Formula (2), the compound of Formula (3), the compound of Formula (4), and the compound of Formula (6), and the compound of Formula (5) is represented by one of Formulae (5a), (5b), (5c), (5d), (5e), (5f), and (5g):

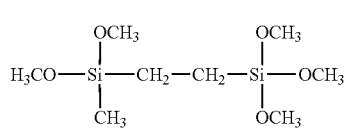 (5a)

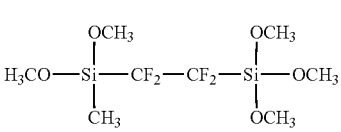 (5b)

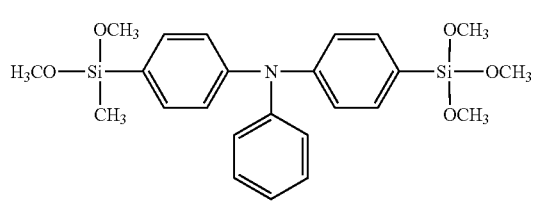 (5c)

-continued

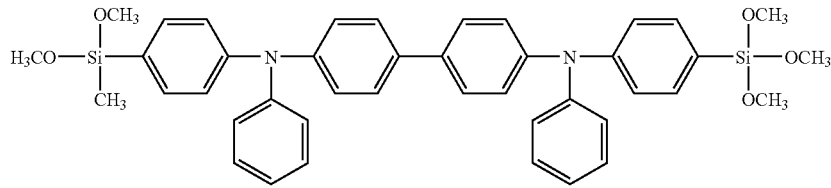
(5d)

(5e)

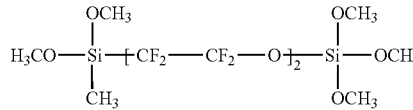
(5f)

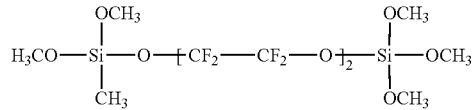
(5g)

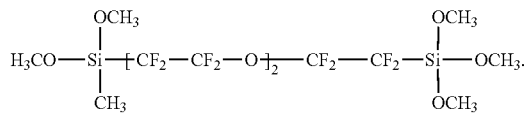

28. The conducting polymer composition of claim 21, wherein the siloxane material is (i) a compound represented by Formula (2), or (ii) the hydrolysate or the condensate of the compound of Formula (6) and optionally at least one compound selected from the group consisting of the compound of Formula (2), the compound of Formula (3), the compound of Formula (4), and the compound of Formula (5), and the compound of Formula (6) is represented by one of Formulae (6a) and (6b):

$$Si(OCH_3)_4 \quad (6a)$$

$$SiCH_3(OCH_3)_3 \quad (6b).$$

* * * * *